US012804976B2

(12) United States Patent
Krames

(10) Patent No.: US 12,804,976 B2
(45) Date of Patent: Nov. 17, 2026

(54) INDIUM-GALLIUM-NITRIDE STRUCTURES AND DEVICES

(71) Applicant: OPNOVIX CORP., Palo Alto, CA (US)

(72) Inventor: Michael R. Krames, Palo Alto, CA (US)

(73) Assignee: Opnovix Corp., Palo Alto, CA (US)

( * ) Notice: Subject to any disclaimer, the term of this patent is extended or adjusted under 35 U.S.C. 154(b) by 124 days.

(21) Appl. No.: 17/746,431

(22) Filed: May 17, 2022

(65) Prior Publication Data

US 2022/0285505 A1 Sep. 8, 2022

Related U.S. Application Data

(63) Continuation of application No. PCT/US2020/061377, filed on Nov. 19, 2020, which
(Continued)

(51) Int. Cl.
*H10D 62/824* (2025.01)
*H10D 62/40* (2025.01)
(Continued)

(52) U.S. Cl.
CPC ......... *H10D 62/824* (2025.01); *H10D 62/405* (2025.01); *H10D 62/8503* (2025.01);
(Continued)

(58) Field of Classification Search
CPC ......... H01L 21/02458; H01L 21/02488; H01L 21/02502; H01L 21/02505; H01L 21/0254; H01L 21/02645; H01L 21/02647; H01L 21/0265; H01L 21/0262; H01L 29/045; H01L 29/2003; H01L 29/205; H01L 33/16; H01L 33/32; H01L 33/007; H01L 33/20; H01L 29/06; H01L 29/0634;
(Continued)

(56) References Cited

U.S. PATENT DOCUMENTS 6,252,261 B1 6/2001 Usui et al.
6,255,198 B1 7/2001 Linthicum et al.
(Continued)

FOREIGN PATENT DOCUMENTS

JP 2014/090169 A1 5/2014
JP 2000012976 1/2020
(Continued)

OTHER PUBLICATIONS

Bi et al., Semiconductor template and fabrication method, 2019, foreign priority application EP 19163334,6, pp. 1-26. (Year: 2019).*
(Continued)

*Primary Examiner* — Natalia A Gondarenko
(74) *Attorney, Agent, or Firm* — Sheppard Mullin Richter & Hampton LLP

(57) ABSTRACT

InGaN layers characterized by an in-plane lattice parameter within a range from 3.19 Å to 3.50 Å are disclosed. The InGaN layers are grown by coalescing InGaN grown on a plurality of GaN seed regions. The InGaN layers can be used to fabricate optical and electronic devices for use in light sources for illumination and display applications.

14 Claims, 23 Drawing Sheets

Related U.S. Application Data is a continuation of application No. 16/689,064, filed on Nov. 19, 2019, now Pat. No. 10,847,625.

(51) Int. Cl.

| | |
|---|---|
| ***H10D 62/85*** | (2025.01) |
| ***H10H 20/825*** | (2025.01) |
| ***H10P 14/20*** | (2026.01) |

(52) U.S. Cl.

CPC ......... *H10H 20/825* (2025.01); *H10P 14/274* (2026.01); *H10P 14/276* (2026.01); *H10P 14/3216* (2026.01); *H10P 14/3238* (2026.01); *H10P 14/3248* (2026.01); *H10P 14/3251* (2026.01); *H10P 14/3416* (2026.01)

(58) Field of Classification Search

CPC . H01L 29/0684; H01L 29/0657; H01L 29/20; H01L 29/78603; H01L 2924/12041; H01L 21/02; H01L 21/02387–02398; H01L 21/02455–02466; H01L 21/02538–02549; H01L 21/0243; H01L 21/0242; H01L 21/02107; H01L 21/764; H01L 21/6254; H01L 21/187; H01L 21/30612; H01L 21/308; H01L 21/20; H01L 21/76251; H01L 21/0259; H01L 21/02601; H01L 21/02642; H01L 21/02658; H01L 21/02664; H10D 62/40; H10D 62/405; H10D 62/83; H10D 62/85; H10D 62/8503; H10D 62/824; H10D 62/881; H10D 62/50; H10D 62/53; H10D 62/82; H10D 62/815; H10H 20/013; H10H 20/825; H10H 20/8252; H10H 20/817; H10H 20/818; H10H 20/0137; H10H 20/8215; H10P 14/272; H10P 14/274; H10P 14/276; H10P 14/3216; H10P 14/3238; H10P 14/3248; H10P 14/3251; H10P 14/3416; H10P 14/24; H10P 14/27; H10P 14/278; H10P 14/2907; H10P 14/2908; H10P 14/2926; H10P 14/32; H10P 14/3258; C30B 29/38; C30B 35/00; H01S 5/34333

USPC ........ 257/76, 28, 615, 618, 74, 189, 29.089, 257/21.09; 438/29, 48, 459, 458, 478, 438/604

See application file for complete search history.

(56) References Cited

U.S. PATENT DOCUMENTS

| | | | | |
|---|---|---|---|---|
| 6,455,340 | B1 | 9/2002 | Chua | |
| 6,489,221 | B2 * | 12/2002 | Gehrke | H01L 21/0242 438/479 |
| 6,515,308 | B1 | 2/2003 | Kneissl | |
| 7,351,347 | B2 | 4/2008 | Akita et al. | |
| 7,663,148 | B2 | 2/2010 | Yi et al. | |
| 7,670,933 | B1 | 3/2010 | Wang et al. | |
| 7,955,983 | B2 | 6/2011 | Imer et al. | |
| 8,729,559 | B2 | 5/2014 | Krames et al. | |
| 9,076,927 | B2 | 7/2015 | Keller et al. | |
| 9,318,326 | B2 | 4/2016 | Von Kanel et al. | |
| 10,847,625 | B1 | 11/2020 | Krames | |
| 10,991,578 | B2 | 4/2021 | Ohlson | |
| 11,393,686 | B2 | 7/2022 | Ohlson | |
| 11,862,459 | B2 | 1/2024 | Ohlson | |
| 2004/0113166 | A1 | 6/2004 | Tadatomo et al. | |
| 2007/0069225 | A1 | 3/2007 | Krames et al. | |
| 2009/0045394 | A1 | 2/2009 | Smeeton | |
| 2009/0278998 | A1 | 11/2009 | El-Ghoroury et al. | |
| 2011/0175126 | A1 | 7/2011 | Yang et al. | |
| 2012/0104360 | A1 | 5/2012 | Hardy et al. | |
| 2014/0103356 | A1 * | 4/2014 | Krames | H01L 33/16 257/76 |
| 2014/0126600 | A1 | 5/2014 | Kawashima | |
| 2014/0131730 | A1 | 5/2014 | Keller et al. | |
| 2015/0099348 | A1 | 4/2015 | Lee et al. | |
| 2015/0140710 | A1 | 5/2015 | McLaurin | |
| 2017/0110630 | A1 * | 4/2017 | Kawakami | H01L 33/007 |
| 2018/0277713 | A1 | 9/2018 | Ciechonski et al. | |
| 2020/0058489 | A1 | 2/2020 | Ohlsson | |
| 2020/0388723 | A1 * | 12/2020 | Ahmed | H01L 33/42 |
| 2021/0013373 | A1 * | 1/2021 | Lee | H01L 33/0093 |
| 2021/0193870 | A1 | 6/2021 | Pernel | |
| 2021/0193873 | A1 | 6/2021 | Pernel | |
| 2022/0246797 | A1 * | 8/2022 | Bi | H01L 21/02516 |
| 2022/0285505 | A1 | 9/2022 | Krames | |
| 2022/0393065 | A1 | 12/2022 | Dussaigne | |
| 2022/0399475 | A1 | 12/2022 | Khan | |
| 2024/0063340 | A1 | 2/2024 | Keller | |
| 2024/0162338 | A1 | 5/2024 | Teo | |
| 2024/0222416 | A1 | 7/2024 | Krames | |
| 2024/0258771 | A1 | 8/2024 | Chan | |
| 2024/0413191 | A1 | 12/2024 | Krames | |

FOREIGN PATENT DOCUMENTS

| | | | |
|---|---|---|---|
| WO | 2012/075461 | A1 | 6/2012 |
| WO | 2013/121289 | | 8/2013 |
| WO | 2017/137635 | | 8/2017 |
| WO | 2017/168012 | | 10/2017 |
| WO | 2019/068919 | A1 | 4/2019 |
| WO | 2021/102198 | | 5/2021 |
| WO | 2021/102198 | A1 | 5/2021 |
| WO | 2021/195595 | A1 | 9/2021 |
| WO | 2022/060611 | | 3/2022 |

OTHER PUBLICATIONS

International Preliminary Report on Patentability for Application No. PCT/US2020/061377, mailed on Jun. 2, 2022, 11 pages.

International Search Report and Written Opinion for Application No. PCT/US2020/061377, mailed on Feb. 22, 2021, 18 pages.

Ema et al., "Influence of Intermediate Layers on Thick InGaN Growth Using Tri-Halide Vapor phase Epitaxy," Japanese Journal of Applied Physics, 2019, vol. 58, p. SC1027-1.

Even, A., "In incorporation improvement in InGaN based active region using InGaN pseudo substrate for monolithic white LED application," Optics, Universite Grenoble Alpes, 2018, HAL Archives, 238 pages.

Even et al., "Enhanced In incorporation in full InGaN heterostructure grown on relaxed InGaN pseudo-substrate," Applied Physics Letters, 2017, vol. 110, p. 262103.

Falub et al., "Perfect crystals grown from imperfect interfaces," Scientific Reports, Jul. 2013, vol. 3, No. 2276, 6 pages.

Hestroffer et al., "Relaxed c-plane InGaN layers for the growth of strain-reduced InGaN quantum wells," Semiconductor Scientific Technology, 2015, vol. 30, 105015, 10 pages.

Hiraski et al., "Growth of thick and high crystalline quality InGaN layers on GaN (0001) substrate using tri-halide vapor phase epitaxy," Journal of Crystal Growth, 2016, 6 pages.

Hu et al., "Growth of InGaN/GaN quantum wells with graded InGaN buffer for green-to-yellow light emitters," Japanese Journal of Applied Physics, 2016, vol. 55, 081001, 6 pages.

Hurni et al., "Bulk GaN flip-chip violet light-emitting diodes with optimized efficiency for high-power operation," Applied Physics Letters, 2015, vol. 106, 031101, 4 pages.

Kishino et al., "Monolithic Integration of InGaN-Based Nanocolumn Light-Emitting Diodes with Different Emission Colors," Applied Physics Express, 2013, vol. 6, 012101, 3 pages.

Ponce et al., "Microstructure and electronic properties of InGaN alloys," Physica Status Solidi, 2003, vol. 240, No. 2, p. 273-284.

Scaccabarozzi et al., "Photoluminescence study of the strain relaxation of GaAs crystals grown on deeply patterned Si substrates," Journal of Crystal Growth, 2014, 4 pages.

(56) References Cited

OTHER PUBLICATIONS

Yin Yao et al., "Investigation on Epitaxial Lateral Overgrowth of InGaN/GaN Multi-Quantum-Well Nanowires", Journal of Nanoscience and nanotechnology, Feb. 2013, No. 13, No. 2, pp. 1389-1391.
Non-Final Office Action mailed on Mar. 9, 2020, for U.S. Appl. No. 16/689,064, 24 pages.
Final Office Action mailed on Jun. 19, 2020, for U.S. Appl. No. 16/689,064, mailed on Jun. 19, 2020, 15 pages.
Notice of Allowance mailed on Jul. 16, 2020, for U.S. Appl. No. 16/689,064, 9 pages.
Non-Final Office Action mailed on Aug. 4, 2021, for U.S. Appl. No. 17/072,333, 8 pages.
Bougrioua et al., Growth of freestanding GaN using pillar-epitaxial lateral overgrowth from GaN nanocolumns, Journal of Crystal Growth, Dec. 2007, vol. 309, Issue 2, pp. 113-120.
Le et al., Controlled coalescence of AlGaN nanowire arrays: An architecture for nearly dislocation-free planar ultraviolet photonic device applications, Advanced Materials, 2016, DOI: 10.1002/adma.201602645, pp. 1-9.
Sanchez-Paramo et al., Structural and optical characteristics of intrinsic GaN nanocolumns, Physica E, 13, 2002, pp. 1070-1073.
U.S. Appl. No. 16/689,064, filed Nov. 19, 2019, which issued as U.S. Pat. No. 10,847,625 on Nov. 24, 2020.
U.S. Appl. No. 17/072,333, filed Oct. 16, 2020, which is abandoned.
U.S. Appl. No. 17/746,431, filed May 17, 2022.
U.S. Appl. No. 18/401,290, filed Dec. 29, 2023.
PCT International Application No. PCT/US2020/061377 filed on Nov. 19, 2020.
PCT International Application No. PCT/US2023/086561 filed on Dec. 29, 2023.
Speakman, Scott A., "Introduction to High Resolution X-Ray Diffraction of Epitaxial Thin Films", Massachusetts Institute of Technology, Center for Materials Science and Engineering, 2012, see p. 2, pp. 1-53. http://prism.mit.edu/xray.
Okada et al., Structural and optical evaluation of InGaN/GaN multi-quantum wells on template consisting of in-plane alternatively arranged relaxed InGaN and GaN, Journal of Applied Physics, vol. 111, No. 4, Feb. 15, 2012, 6 pages.
Soh et al., Cool white III-nitride light emitting diodes based on phosphor-free indium-rich InGaN nanostructures, Applied Physics Letters, vol. 92, No. 26, Jul. 1, 2008, 4 pages.
Wurm et al., Demonstration of device-quality InGaN grown on porous GaN tiles by MBE with an in-plane lattice constant equivalent to fully relaxed In0.12Ga0.88N, 2022 Compound Semiconductor Week (CSW), IEEE, Jun. 1, 2022, 2 pages.
International Preliminary Report on Patentability for International Application No. PCT/US2023/086561, issued on Jul. 1, 2025, 13 pages.
International Search Report and Written Opinion for International Application No. PCT/US2025/035780 mailed on Oct. 16, 2025, 33 pages.
International Search Report and Written Opinion for International Application No. PCT/US2025/035752, mailed on Oct. 29, 2025, 22 pages.
Annex to Form PCT/ISA/206 Communication Relating to the Results of the Partial International Search for PCT/US2023/086561 mailed on Apr. 17, 2024, 17 pages.

* cited by examiner

INDIUM-GALLIUM-NITRIDE STRUCTURES AND DEVICES

This application is a continuation of International Application No. PCT/US2020/061377, filed on Nov. 19, 2020, which claims priority to U.S. application Ser. No. 16/689,064, filed on Nov. 19, 2019, now issued as U.S. Pat. No. 10,847,625, each of which is incorporated by reference in its entirety.

FIELD

The present disclosure relates to indium-gallium-nitride (InGaN) layers having a substantially relaxed region and to devices fabricated upon the InGaN layers. The substantially relaxed Wurtzite (0001) InGaN regions have an in-plane, or "a", lattice parameter greater than or equal to 3.19 Å. The substantially relaxed InGaN regions are grown on a plurality of III-nitride seed regions such as GaN, InGaN, AlGaN, or MN seed regions. During growth, InGaN grown on the seed regions relaxes and coalesces to provide substantially relaxed InGaN regions that can be used as a growth surface for other semiconductor materials. The InGaN layers can be used to fabricate optical and electronic devices for use as light sources in systems for illumination and display applications.

BACKGROUND

Compound semiconductor materials are typically deposited, or grown, atomically-lattice-matched to a growth substrate to avoid the generation of growth defects such as dislocations. In some cases, it is desirable that the lattice parameter of a compound semiconductor material be altered to provide materials and/or devices and/or systems with particular characteristics.

InGaN is currently the material of choice for the active layer(s) of GaN-based optoelectronic devices including, for example, blue- or violet-emitting light-emitting diodes (LED) which are currently the basis for most LED-based illumination and display systems commercialized to date, and the violet-emitting laser diode (LD) which is the basis for the Blu-Ray™ industry. Today, such devices are manufactured using InGaN active layers grown pseudomorphically on gallium-nitride (GaN) epitaxial layers. Unfortunately, the crystalline atomic lattice parameter of InGaN is larger than that of GaN, resulting in severe strain, and increasingly poor material quality with increasing InN mole fraction or increasing thickness for InGaN grown on GaN (InGaN/GaN). This limits the performance of optoelectronic devices based on InGaN/GaN including, for example, LEDs and LDs.

Attempts to grow high-quality, planar, relaxed InGaN for device applications have so far been unsuccessful in commercialization. Graded-layer approaches, used in certain III-V material systems, have been attempted for InGaN using low-temperature molecular beam epitaxy (MBE). However, the relaxation mechanism is associated with the appearance of a high density of misfit dislocations, stacking faults, and threading dislocations, leading to poor material quality. Similar approaches using commercially preferred metal organic chemical vapor deposition (MOCVD) for c-plane InGaN are compromised by the lack of a slip system for (polar) c-plane growth and attempts to exploit non- and semi-polar growth planes result in material having a high defect density. Hydride vapor phase epitaxy (HYPE) has been used to grow thick InGaN layers with the objective of reducing crystalline defects, but the approach is limited in terms of achievable InN mole fractions and is only applicable to N-polar surfaces and therefore is not ideal for low-cost manufacturing. Growth of strained InGaN layers that can be lifted-off and bonded to compliant carriers to facilitate relaxation has been attempted, but the method results in limited lattice dilation and non-planar, trenched, surfaces. The use of nano-column or nano-rod device structures designed to avoid strain limits of conventional heteroepitaxy results in non-planar device geometries less suitable for manufacturing and can exhibit low optical quality.

The use of patterning and re-growth has been used to grow high quality, lattice-mismatched heteroepitaxy for single-element (e.g., Ge on Si) and binary III-V (e.g., GaAs on Si) zinc-blende semiconductors. However, similar approaches for Wurtzite semiconductors and/or ternary alloys such as InGaN have not been successful.

SUMMARY

According to the present invention, a III-nitride semiconductor structure, comprises (a) seed regions comprising $In_xGa_{1-x}N$ ($0 \le x < 1$) and a Wurtzite III-nitride crystal structure; (b) a first plane parallel to a (0001) plane of the Wurtzite III-nitride structure and intersecting the seed regions; wherein, an intersection of the first plane and a first edge of a seed region locates a $In_xGa_{1-x}N/In_yGa_{1-y}N$ heterojunction, wherein $0 < y \le 1$ and $y > x$; and the $In_xGa_{1-y}N/In_yGa_{1-y}N$ heterojunction is coplanar with a first crystallographic plane of the seed region; (c) any second plane parallel to the (0001) plane of the Wurtzite III-nitride crystal structure and intersecting a second edge of the seed region locates a III-nitride heterojunction, wherein the III-nitride heterojunction is coplanar with a second crystallographic plane of the seed region; and (d) a (0001) InGaN region overlying the seed regions, wherein the (0001) InGaN region is characterized by an in-plane a-lattice parameter that is greater than 3.19 Å, wherein each of the first crystallographic plane and the second crystallographic plane is crystallographically equivalent.

According to the present invention, semiconductor devices comprise a III-V semiconductor structure according to the present invention.

According to the present invention, lighting systems comprise the semiconductor device according to the present invention.

According to the present invention, display systems comprise the semiconductor device according to the present invention.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1A:
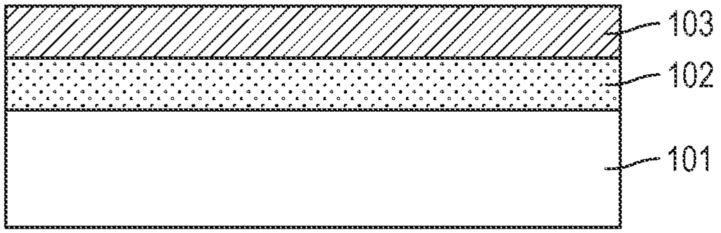
FIGS. 1A-1E show an example of a process flow for fabricating an InGaN layer having a relaxed InGaN region provided by the present disclosure.

"Substantially uniform lattice parameter" refers to a semiconductor layer characterized by a local lattice parameter of the semiconductor layer that varies less than 1% with respect to an average lattice parameter such as, for example, less than 0.5% with respect to an average lattice parameter, or less than 0.1% with respect to an average lattice parameter.

"Defect density" refers to the density, in plain view, of extended defects, such as dislocations, in a semiconductor layer. The defect density can be determined using, for example, etching (and counting etch pit density, EPD), cathodoluminescence to observe and count dark spots, atomic force microscopy (AFM) to observe and count small pits.

A lattice parameter can be determined using X-ray diffraction (XRD) and reciprocal space map (RSM) analysis. High-angle, or near grazing incidence, XRD techniques can be used to determine the lattice parameter of upper layers in a structure in which the lattice parameter may vary as a function of depth.

"III-V material" refers to a compound semiconductor material comprising at least one column-III element and at least one column-V element from the Periodic Table.

"Growth plane" refers to a plane parallel to the deposition plane of material onto a planar surface, such as that of a conventional substrate growth surface.

"Substantially perpendicular to the growth plane" refers to a surface that forms an angle with respect to the growth plane that is approximately 90 degrees such as from 88 degrees to 92 degrees with respect to the growth plane.

Wurtzite GaN is characterized by a Wurtzite crystal structure having room-temperature a- and c-lattice parameters of 3.189 Å, and 5.185 Å, respectively. The crystal plane normal to the c-lattice parameter direction ("c-direction") is the c-plane, which has a Ga-face (0001) and a N-face (000-1). The plane that contains the c-direction and is perpendicular to the a-lattice parameter direction ("a-direction") is the (11-20) plane, or "a-plane". The plane containing the c-direction and rotated 30 degrees with respect to the a-direction is the (1-100) plane, or "m-plane".

Wurtzite $In_xGa_{1-x}N$ has the same crystal structure as Wurtzite GaN, but includes a non-zero molar fraction of InN, x, to form a ternary compound wherein a specified fraction of column-III atoms are In and the remainder are Ga. InN has room-temperature a- and c-lattice parameters of 3.545 Å, and 5.703 Å, respectively, and $In_xGa_{1-x}N$ has room-temperature a- and c-lattice parameters of between that of GaN and InN, and according to the molar fraction.

Although the present description focuses on growing (0001) InGaN on a GaN seed surface, the method is applicable to other Wurtzite materials, such as InGaN on MN, AlGaN on MN, and AlGaN on GaN. Furthermore, the invention is applicable to non-basal-plane Wurtzite structures, such as so-called non- and semi-polar GaN and related materials. Finally, the invention is also applicable to other compound semiconductor systems, including zinc blende materials such as InGaAs on GaAs, and InGaSb on GaSb, and II-VI compound semiconductor systems.

"Relaxed InGaN" refers to InGaN material that exhibits an in-plane lattice parameter that is equal to, or nearly equal to, that of fully relaxed InGaN material. For example, Wurtzite relaxed InGaN has a room-temperature a-plane lattice parameter greater than 3.189 Å(0% InN) and up to 3.545 Å (100% InN). This is in contrast to a strained InGaN material, such as InGaN which is grown pseudomorphic to GaN and thus exhibits an in-plane lattice parameter equal to, or nearly equal to, that of GaN (that is, ~3.189 Å), regardless of InN mole fraction. Such strained InGaN material is referred to as InGaN/GaN.

"In-plane lattice parameter" refers to crystal lattice spacing within the growth plane. For (0001) material, the in-place lattice parameter is the a-lattice parameter.

"Lateral growth" refers to growth in a direction other than normal to the growth plane, including parallel to the growth plane.

Reference is now made in detail to certain embodiments of materials, semiconductor structures, optoelectronic devices, and methods. The disclosed embodiments are not intended to be limiting of the claims. To the contrary, the claims are intended to cover all alternatives, modifications, and equivalents.

The present invention teaches the formation of a large-area, planar, coherent, at least partially but substantially uniformly relaxed compound semiconductor material layer for use in an optical and/or electronic device. Large area refers to areas larger than 1 $mm^2$ such as larger than 1 $cm^2$ in extent. Planar refers to a semiconductor layer that exhibits at least one surface that is substantially flat and is largely free of significant thickness variations within the large area. For example, a planar semiconductor layer can have an RMS roughness less than 1 nm, as determined using atomic force microscopy. A planar semiconductor layer can have a thickness, for example, within +/−10% of the average thickness. Coherent refers to the fact that the material is substantially crystalline, as opposed to amorphous. Relaxed refers to the fact that the in-plane lattice parameter of the material is approximately that of a free-standing, coherent, 100% relaxed version of the material. Substantially relaxed refers to a material in which the in-plane lattice parameter of the material is within 30% of that of a free-standing, coherent, 100% relaxed version of the material. Uniformly refers to a substantially non-varying in-plane lattice parameter within the large area, upon which optical and/or electronic device structures can be built. In addition, the invention is applicable to a wide range of semiconductor crystal systems, including Wurtzite crystal structures, and to high-order alloys including ternary and quaternary alloys. Finally, the invention is suitable for structures grown by a number of growth methods, but in particular metal-organic chemical vapor deposition (MOCVD).

In particular, the present invention teaches the formation of a large-area, planar, coherent, at least partially but substantially uniformly relaxed indium gallium nitride (InGaN) material layer for use as a base layer for an optical and/or electronic device. Various compositions (i.e., InN molar fractions) are achievable. Coherent refers to the fact that the InGaN material is substantially crystalline, as opposed to amorphous. Relaxed refers to the fact that the InGaN material's lattice parameter is approximately that of a free-standing, coherent, 100% relaxed InGaN material of the same composition. Uniformly relaxed refers to layers with in-plane lattice parameters that are largely non-varying over the vast majority of the large area in a plane containing the growth plane. Such relaxed InGaN material is referred to, in the present invention, as relaxed InGaN such as Native InGaN®.

The invention further teaches the formation of optical and/or electrical devices and systems based on said Relaxed InGaN, which may include other InGaN layers grown pseudomorphically to relaxed InGaN (i.e., InGaN/InGaN), such as Native InGaN®.

Other features and aspects of this invention will be apparent from the following description and the accompanying drawings. In particular, the teachings in the present invention are applicable to other compound semiconductor device materials, such as aluminum gallium nitride, aluminum gallium indium nitride, III-As, III-P, III-Sb, etc.

The present invention discloses the use of a semiconductor seed material deposited on a substrate to register crystalline growth of a compound semiconductor material. The seed material has a plurality of seed regions with edges that are planar seed surface portions and each normal to these planar seed surface portions have a crystallographically equivalent direction that is not parallel to a normal to the large area of the substrate. The limited (preferably, one) number of exposed planar seed surface crystallographically equivalent orientations ensures uniform relaxation and compositional control of the InGaN material grown thereon, avoiding competing growth modes and problems associated with uncontrolled compositional control such as non-uniform InN incorporation, rough surfaces, etc., when variable seed surface orientations are presented for InGaN growth simultaneously. The dimensions of the seed surface portions are limited in extent such that additional compound semiconductor material can be seeded and readily relax, during growth, towards its relaxed lattice parameter. The resulting "relaxed" compound semiconductor material is subsequently grown out and coalesced to form a large-area (i.e., area greater than ×1 $mm^2$, preferably greater than 1×1 $cm^2$) film. The large-area, relaxed compound semiconductor material film provides a template for the growth of improved optical and/or electronic device structures.

In particular, the present invention discloses the use of GaN seed regions with seed surface portions to register crystalline growth of InGaN. The dimensions of, and geometries associated with the GaN seed surface(s) are limited in extent such that the InGaN material can be seeded and readily relax during growth towards its relaxed lattice parameter. The crystallographic direction characterizing the normals to the planar seed surface portions may be a non-polar direction, such as (11-20) or (1-100) or a plane rotated between them, or a semi-polar direction, such as (1-101). The (relaxed) InGaN layer is subsequently grown out and coalesced into a planar, large-area film. The large-area, relaxed InGaN film provides a template for the growth of improved InGaN-based optical and/or electronic device structures.

An example of a method for growing a relaxed InGaN region is shown in FIGS. 1A-1E.

Figure 1B:
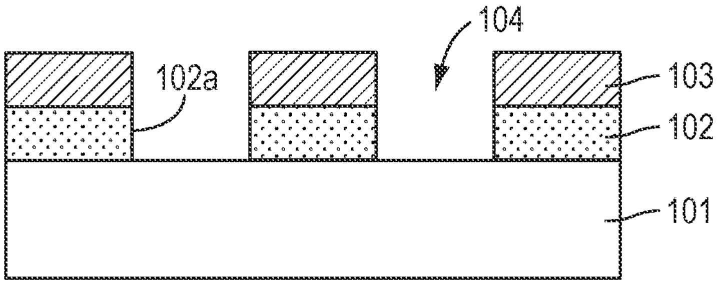
Figure 1C:
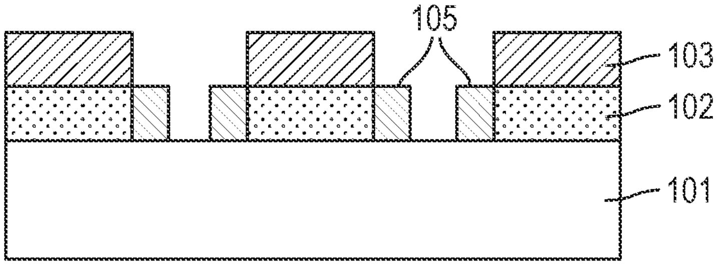
Figure 1D:
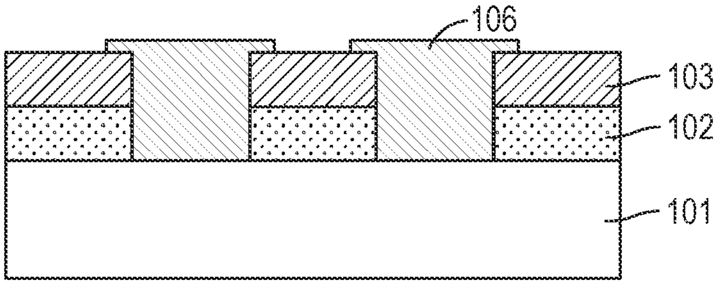
Figure 1E:
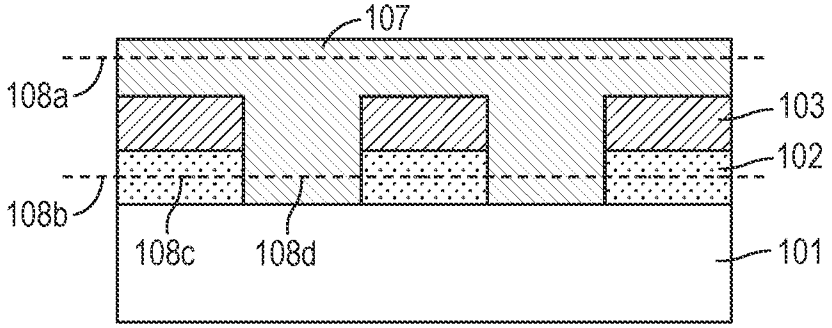

As shown in FIG. 1A, a primarily (0001), i.e., c-plane, GaN (or MN) layer 102 can be grown on a substrate 101 using any suitable semiconductor growth method. Examples of suitable substrates include, as sapphire, silicon carbide, silicon, aluminum nitride, and gallium nitride. Other useful substrate materials include engineered substrates such as silicon-on-insulator (SOI). The GaN layer can be, for example, less than 3 μm thick, less than 0.3 μm thick, or less than 0.03 μm in thick. The GaN layer 102 can be overcoated with a masking layer 103 of a material that is slow to promote III-nitride material nucleation. Suitable masking materials include, for example, dielectrics such as silicon nitride, silicon oxide, and aluminum oxide. The masking layer 103 and underlying GaN layer 102 can be patterned and etched using photolithography such as using nanolithography and wet and/or dry etching techniques to provide a desired pattern as shown in FIG. 1B. The etched regions 104 where the mask and GaN material have been removed, expose GaN seed surfaces **102*a*. The seed surfaces can be substantially perpendicular to the GaN (0001) c-plane. As shown in FIG. 1C, GaN seed surfaces 102*a* can be used for at least lateral growth of InGaN 105, forming InGaN/GaN heterojunctions that are not co-planar with the substrate 101. Each exposed GaN seed surface can have an equivalent crystallographic orientation. For example, the GaN seed surfaces can be primarily (1-100), i.e., m-plane, or primarily (11-20), i.e., a-plane, or any plane rotated between the m- and a-planes. Moreover, the seed surfaces 102*a* can be intentionally mis-oriented with respect to the main GaN crystal planes, for example, to promote favorable and uniform growth characteristics. FIG. 1E shows a plane 108*a* through the relaxed InGaN region and co-planar with surface 107, and a plane 108*b* bisecting the seed regions 102, and the InGaN regions between seed regions 102. A center of a seed region is indicated as 108***c* and a center of an InGaN region between the seed regions 102 is indicated by 108*d*.

The orientation of the GaN seed surface can be determined by the patterning and upon the growth orientation of the GaN layer. The orientation of the seed surface is further dependent on the angle of the surface of the etched GaN layer. For example, for a (0001) GaN layer and near vertical etching, the orientation of the GaN seed surface can vary from approximately (1-100) to (11-20) and any orientation rotated in between them. This orientation can be selected to optimize InGaN growth conditions and InGaN material quality.

For InGaN growth on certain GaN seed surfaces, especially those substantially perpendicular to the main surface of the substrate, to facilitate coalescence, it may be desirable to enhance lateral-vs-vertical growth by optimizing growth conditions and/or choosing GaN seed surface orientation that promotes a fast growth rate.

The small dimensions of the GaN seed surface promote relaxation of the InGaN material deposited thereon, and provides a planar, crystallographic orientation to facilitate coherent InGaN growth. During growth, InGaN grows coherently and relaxes toward its relaxed lattice parameter, and eventually coalesces with a neighboring InGaN growth front. Referring to FIG. 1C, InGaN 105 is grown from the GaN seed surface and in FIG. 1D InGaN 106 is grown to fill the etch cavity and over the mask layer 103. Continued InGaN growth causes InGaN grown on the GaN seed surfaces in adjacent cavities to coalesce. The relaxed InGaN is then grown above the masking layer, to form a continuous, planar, relaxed InGaN region or InGaN template at the upper InGaN growth surface 107.

In the present InGaN growth method, relaxation occurs mostly laterally, i.e., by twist, rather than by tilting which occurs when InGaN relaxation is attempted directly on a GaN (0001) surface. The latter approach introduces vertical InGaN strain gradients which become problematic during subsequent growth and coalescence of the InGaN. Instead, the present invention provides for reduced tilting which allows the final coalesced film to be substantially free of strain and/or compositional inhomogeneities, thus providing a high quality planar relaxed InGaN large-area surface for semiconductor growth. Moreover, because relaxation occurs uniformly at the GaN seed surface, vertical strain gradients, which can be generated when strained layers are first grown pseudomorphically (then etched and relaxed), are largely avoided.

In the InGaN growth methods provided by the present disclosure, InGaN growth is to occur mainly at surfaces of the GaN seed material, and growth of InGaN on other exposed surfaces should be minimized or avoided altogether. For this reason, it can be beneficial to etch through the GaN seed material and into the underlying substrate, to move the substrate growth surface away from the InGaN nucleation region. In addition, growth conditions of the InGaN layer can be selected to promote growth at one or more GaN seed surfaces as opposed to InGaN nucleation and growth on the substrate, which would present a competitive growth mode. This approach is illustrated in FIGS. 2A-2E where etching both the GaN layer and a portion of the substrate is etched. By etching the substrate, the distance between competitive growth (at the substrate surface) and the desirable growth at the one or more surfaces of the GaN seed material is increased with the objective of rendering InGaN grown on the substrate non-competing. Furthermore, etching the substrate can serve to frustrate nucleation and growth of InGaN, which further reduces the possibility of interfering competitive growth modes.

Figure 2A:
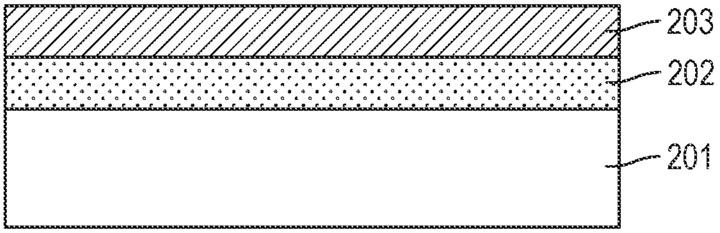
FIGS. 2A-2E shows an example of a process flow for fabricating an InGaN layer having a relaxed InGaN region provided by the present disclosure.
Figure 2B:
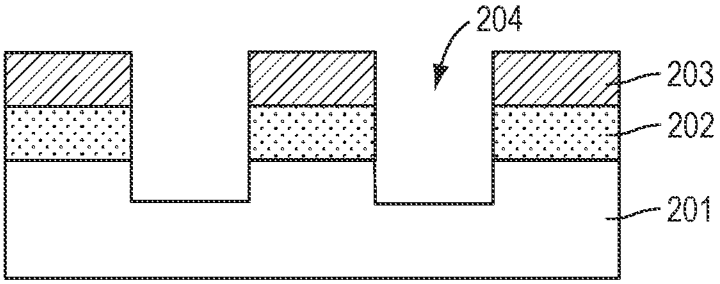
Figure 2C:
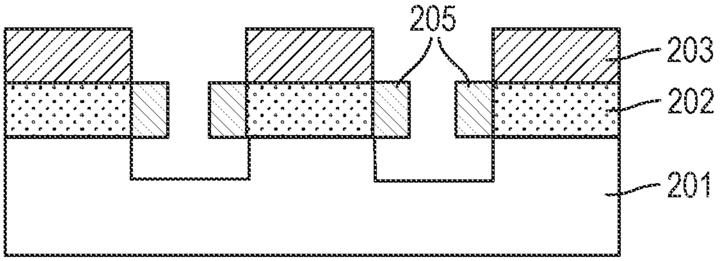
Figure 2D:
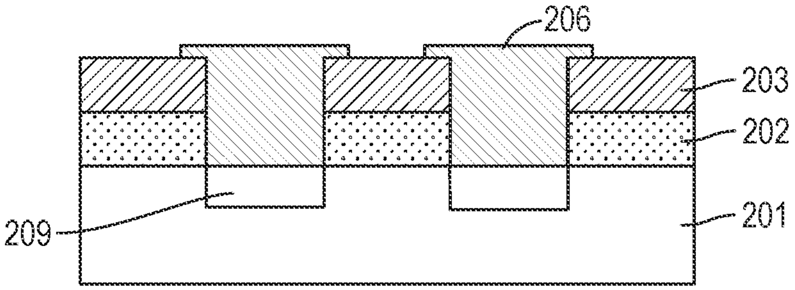
Figure 2E:
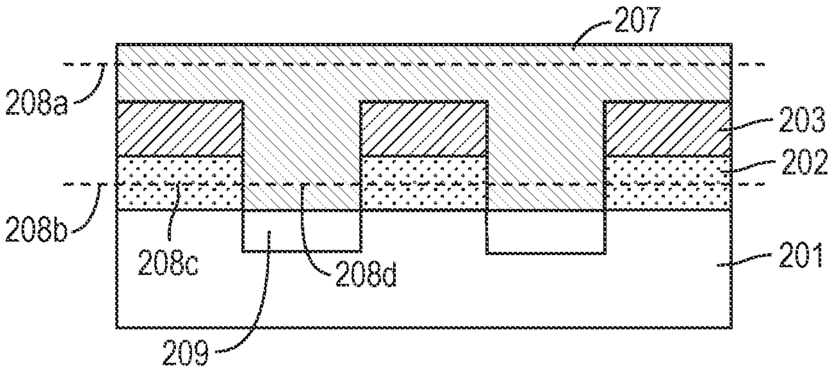

FIG. 2A shows a substrate 201, an overlying GaN layer 202, and an overlying mask layer 203. In FIG. 2B the mask layer 203, GaN layer 202 and a portion of the substrate 201 has been etched to provide cavities 204 with exposed GaN seed surfaces 202*a*. As shown in FIG. 2C, InGaN 205 is grown on the GaN seed surfaces 202*a* and laterally into the respective cavity 204 and above the substrate 201. As shown in FIG. 2D, continued InGaN growth 206 causes the lateral growth regions to merge and grow out of the cavities and over the mask layer 203. A portion 208 of cavity 204, that is a void, can be created between the substrate 201 and the merged InGaN 206 within the cavity. As shown in FIG. 2E, continued InGaN growth causes the InGaN grown from adjacent cavities to coalesce and form a relaxed InGaN surface 207, which can be used for growth of semiconductor layers. FIG. 2E shows a plane 208*a* through the relaxed InGaN region and co-planar with surface 207, and a plane 208*b* bisecting the seed regions 202, and the InGaN regions between seed regions 202. A center of a seed region is indicated as 208*c* and a center of an InGaN region between the seed regions 202 is indicated by 208*d*.

Figure 13:
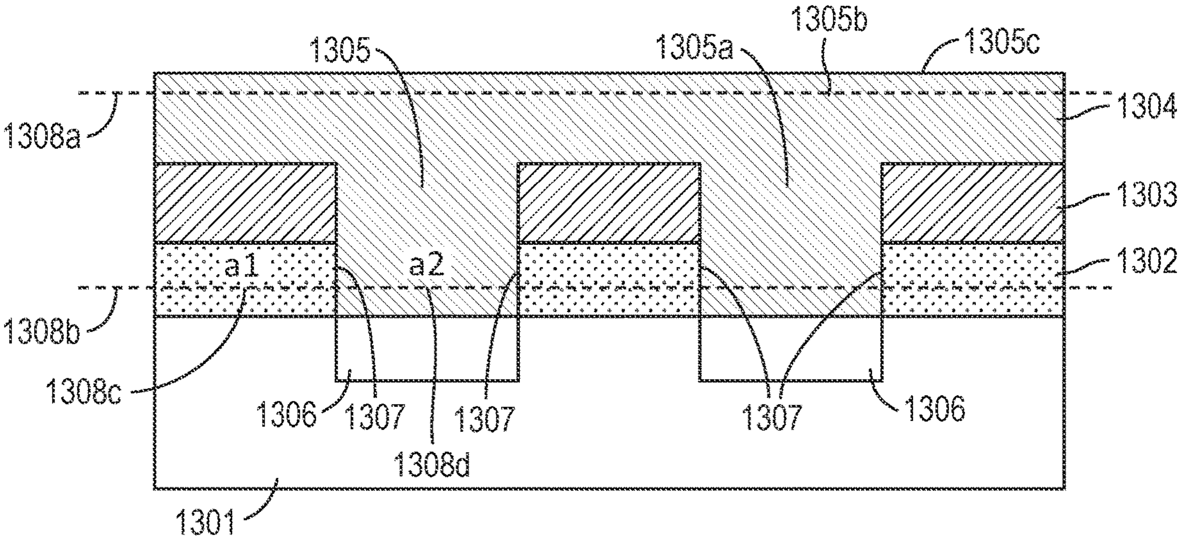
FIG. 13 shows a cross-sectional view of an example of a III-nitride semiconductor structure provided by the present disclosure.

FIG. 13 is a detailed cross-section view of a structure resulting from the process flow illustrated in FIGS. 2A-2E. A substrate 1301, such as (0001) sapphire, includes optionally etched regions 1306 extending into the substrate 1301. GaN (or MN) seed layer material 1302, characterized by in-plane a-lattice parameter a1, overlies the substrate 1301 in the non-etched regions, and below masking layer 1303. InGaN 1305 has been nucleated at the edges of seed layer material 1302 on GaN seed surfaces 1307, forming InGaN/GaN heterojunctions 1307 (i.e. a heterojunction is located at the interface between the InGaN region and the GaN seed region), with a normal that share an equivalent crystallographic direction that is not parallel to the primary surface of substrate 1301. The InGaN material 1305 has been grown out, at least partially laterally, to relax towards the relaxed InGaN in-plane a-lattice parameter a2, in InGaN regions between GaN seed surfaces. A plane 1308*b* parallel to the primary surface of the substrate 1301 and bisecting the GaN seed surface 1307 is characterized by different in-plane a-lattice parameters at different positions within the cross-section. For example, at a center point within the GaN seed regions, the lattice parameter along plane 1308*b* is characterized by a1 commensurate with that of the GaN a-lattice parameter, and at a center point 1305 between the GaN seed surfaces 1307, the lattice parameter along plane 1308*b* is approximately a2, commensurate with that of at least partially relaxed InGaN, and according to the average molar fraction of InN in that InGaN layer, which is determined, among other things, by epitaxial growth conditions such as temperature and relative flow rates of organometallic precursors such a trimethyl-indium (TMI) compared to that of trimethyl-gallium (TMG) in MOCVD. In regions between these two center points, the lattice parameter along plane 1308*b* is characterized by an in-plane a-lattice parameter greater than a1 and less than a2, since a2>a1. In plan-view (not shown) the variation in in-plane a-lattice parameter within plane 1308*a* is characterized by the two-dimensional mask pattern applied to the GaN seed layer (see FIGS. 5 and 6).

The InGaN material is coalesced above the masking layer 1303 to form a relaxed InGaN region 1304 with planar InGaN surface 1305*c*. A plane 1308*a* parallel to the primary surface of the original growth substrate and positioned within relaxed InGaN region 1304 is predominantly characterized by an in-plane a-lattice parameter a2. In particular, at a center point 1305 between the GaN seed surfaces, the InGaN lattice parameter along plane 1308*a* is characterized by a2, and at a center point above the GaN seed surfaces, the InGaN a-lattice parameter along plane 1308*a* is slightly less than a2. In plan-view (not shown) the variation in in-plane a-lattice parameter within plane 1308*a* is characterized by the two-dimensional mask pattern applied to the GaN seed layer (see FIGS. 5 and 6). Variations in the in-plane a-lattice parameter for InGaN can be detected, for example, using XRD and RSM, and can be resolved at the sub-micrometer scale, and in upper surfaces using grazing incidence angle techniques. The mid-point of plane 1308*b* within the seed region is indicated as 1308*c* and the mid-point of plane 1308*b* between the seed regions is indicated as 1308*d.*

GaN seed regions 1302 have in-plane dimensions, for example, that are less than 3 μm, less than 0.3 μm, or less than 0.03 μm. The height of GaN seed regions 1302 can be, for example, less than 3 μm, less than 0.3 μm, or less than 0.03 μm. The distances between neighboring GaN seed regions 1302, e.g., the width of GaN seed regions 1302, can be less than 3 μm, less than 0.3 μm, or less than 0.03 μm. The thickness of mask layer 1303 can be, for example, from 0.01 μm to 1 μm, from 0.02 μm to 0.8 μm, from 0.05 μm to 0.5 μm, or from 0.1 μm to 0.4 μm.

FIGS. 3A-3E show an example of a process flow for fabricating relaxed InGaN using a SOI substrate. In this embodiment, it can be desirable to include strain-control interlayers, such as GaN, AlGaN, or AlInGaN within the semiconductor structure (not shown) to manage wafer bow, as is well known for the growth of GaN on Si.

Figure 3A:
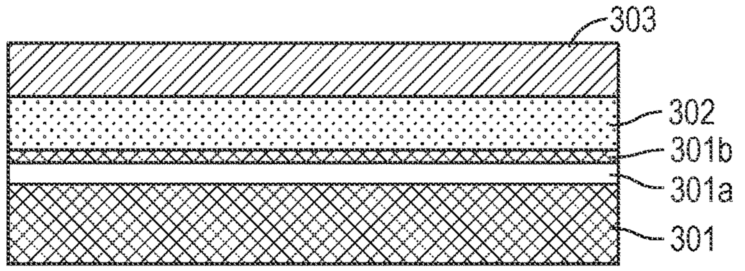
FIGS. 3A-3E show an example of a process flow for fabricating an InGaN layer having a relaxed InGaN region provided by the present disclosure.
Figure 3B:
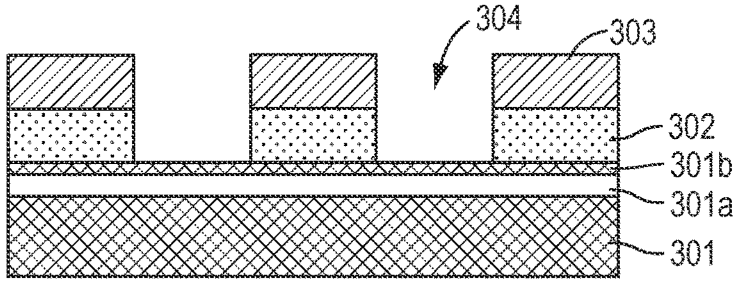
Figure 3C:
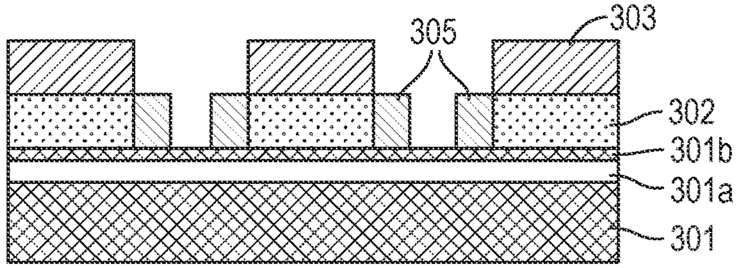
Figure 3D:
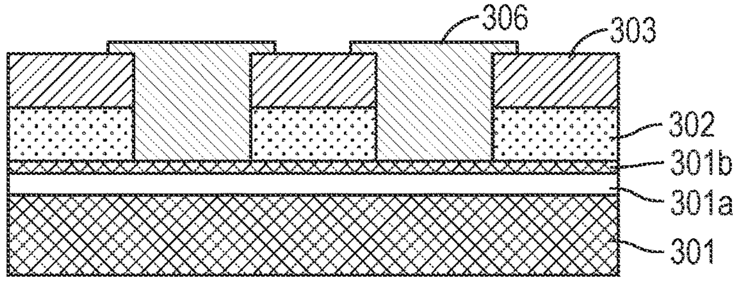
Figure 3E:
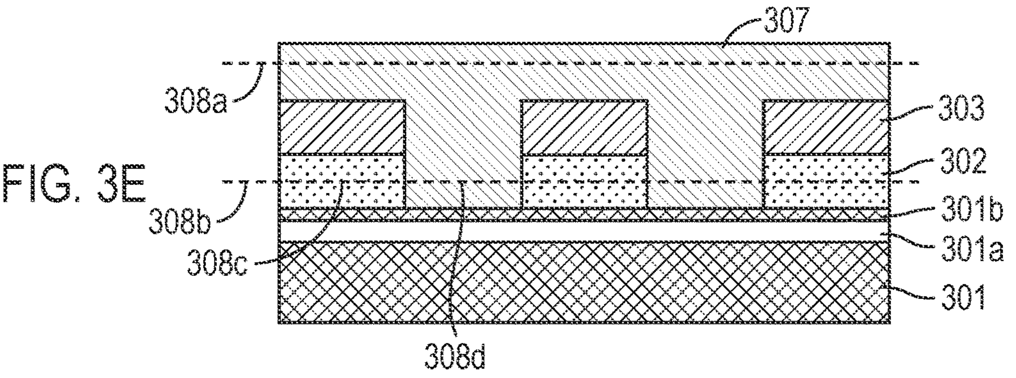

FIG. 3A shows substrate 301, oxide layer 301*a* and silicon layer 301*b*, seed layer 302, and mask layer 303. FIG. 3B shows cavity 304 after etching down to silicon layer 301*b*, which forms seed regions from seed layer 302. FIG. 3C shows lateral growth of InGaN on the edge surfaces of seed regions from seed layer 302 within the cavities 304. This InGaN growth has a sufficiently high molar fraction of InN to induce strain relaxation. In FIG. 3D, InGaN growth 306 from the seed layer 302 has grown out and merged to fill the cavity and to extend over mask 303. As shown in FIG. 3E, continued InGaN growth provides a planar relaxed InGaN layer 307. FIG. 3E shows a plane 308*a* through the relaxed InGaN region and co-planar with surface 307, and a plane 308*b* bisecting the seed regions 302, and the InGaN regions between seed regions 302. A center of a seed region is indicated as 308*c* and a center of an InGaN regions between the seed regions 302 is indicated by 308*d.*

FIGS. 4A-4E show another example of a process flow for fabricating a relaxed InGaN layer using a SOI substrate. This example is similar to that of FIGS. 3A-3E, with the addition that the top silicon layer of the SOI substrate 401*b* and buried oxide layer 401*a* are removed by etching (in regions 404) to minimize competing growth of InGaN on the silicon substrate and to favor InGaN growth on the seed surfaces.

Figure 4A:
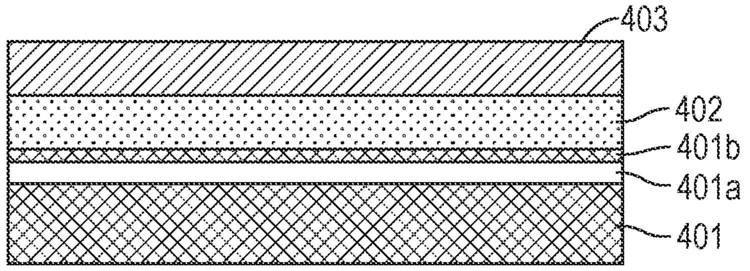
FIGS. 4A-4E show an example of a process flow for fabricating an InGaN layer having a relaxed InGaN region provided by the present disclosure.
Figure 4B:
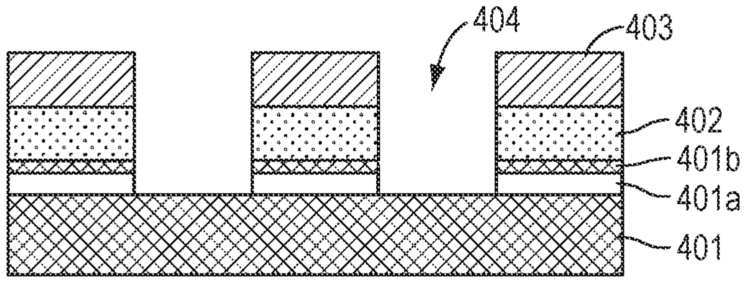
Figure 4C:
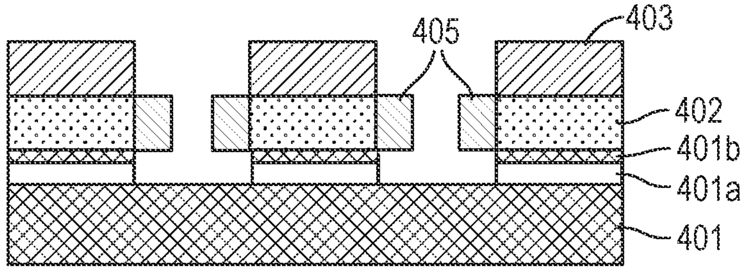
Figure 4D:
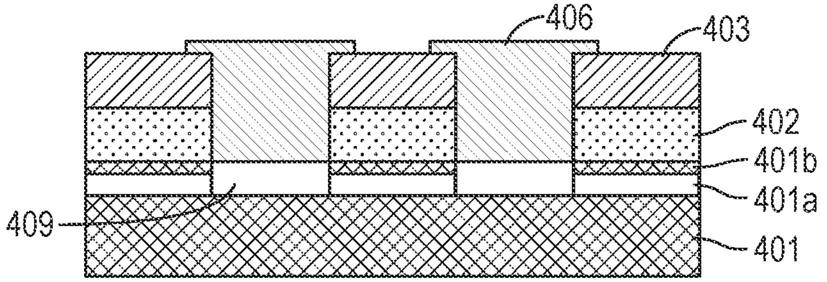
Figure 4E:
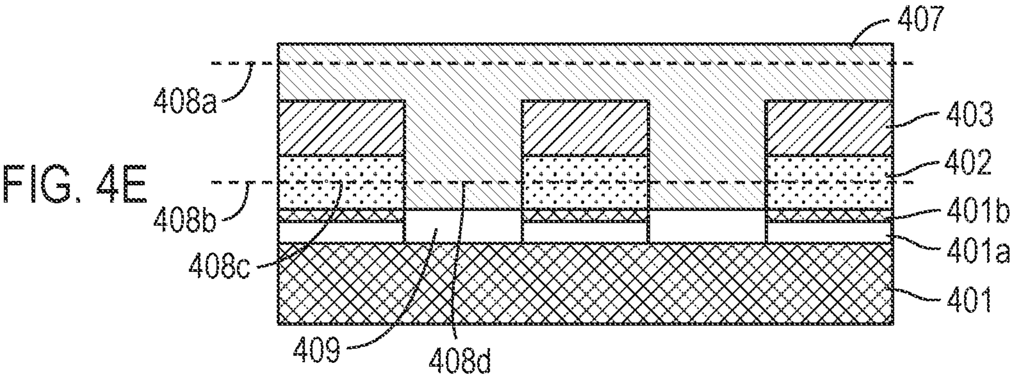

FIG. 4A shows SOI substrate 401, oxide layer 401*a* and silicon layer 401*b*, seed layer 402, and overlying mask layer 403. FIG. 4B shows cavity 404 resulting from etching down to substrate 401 which forms seed regions from seed layer 402. In FIG. 4C, lateral InGaN growth 405 extends from edge surfaces of seed layer 402 into the cavity 404. This InGaN growth has a sufficiently high molar fraction of InN to induce strain relaxation. As shown in FIG. 4D, continued InGaN growth 406 causes InGaN grown from opposite seed surfaces to merge and to grow vertically to fill the upper portion of the cavity and to extend over the mask layer 403. Preferential growth from the seed surfaces compared to growth on the substrate creates a space 408, that is, a void, between the substrate 401 and InGaN layer 406. As shown in FIG. 4E, continued InGaN growth provides a planar relaxed InGaN layer 407. FIG. 4E shows a plane 408*a* through the relaxed InGaN region and co-planar with surface 407, and a plane 408*b* bisecting the seed regions 402, and the InGaN regions between seed regions 402. A center of a seed region is indicated as 408*c* and a center of an InGaN regions between the seed regions 402 is indicated by 408*d.*

Figure 5:
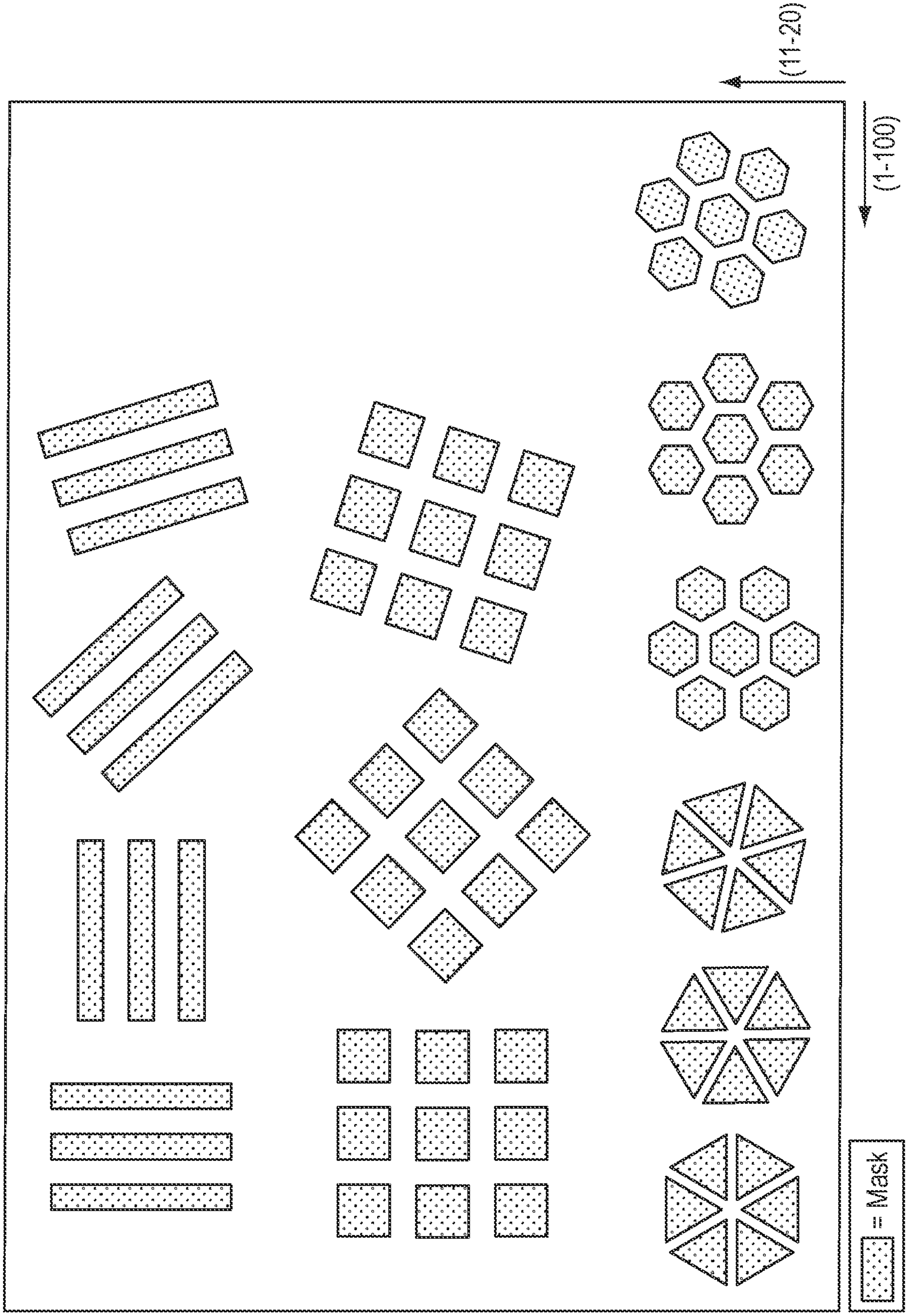
FIG. 5 shows an example of a positive etch mask having various shapes, dimensions, and orientations with respect to the (1-100) and (11-20) crystallographic directions of a III-nitride Wurtzite material.

FIG. 5 shows examples mask patterns for etching the seed material, including stripes, rectangles, triangles, and hexagons. For Wurtzite material like III-nitride materials, including InGaN, preferred pattern features are ones with edges that share an equivalent crystallographic orientation, such as hexagonal or triangular. Other shapes and other relative dimensions can be used. The narrowest dimensions of the mask patterns can be, for example, less than 3 μm, less than 0.3 μm, or less than 0.03 μm. The edges of the mask patterns can be aligned to certain crystal planes. For example, for Wurtzite materials with a (0001) primary growth plane, the mask edges can be aligned to (1-100) or (11-20) planes, or any orientation in between those to facilitate growing a high quality, relaxed InGaN layer.

Figure 6:
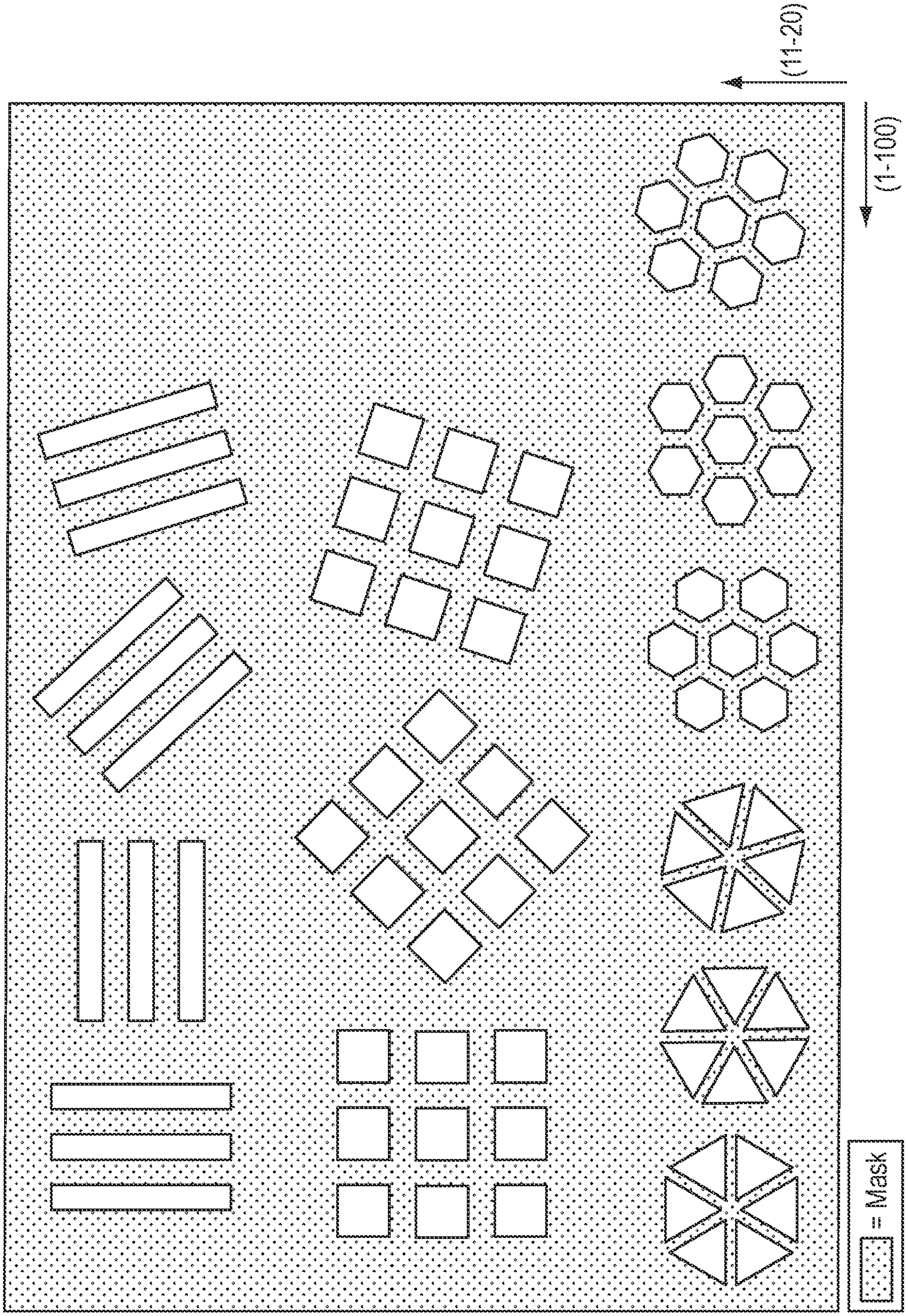
FIG. 6 shows an example of a negative etch mask having various shapes, dimensions, and orientations with respect to the (1-100) and (11-20) crystallographic directions of a III-nitride Wurtzite material of GaN.

FIG. 6 shows an alternative set of mask patterns, which are the negative of those shown in FIG. 5, but similar in other respects.

Figure 7:
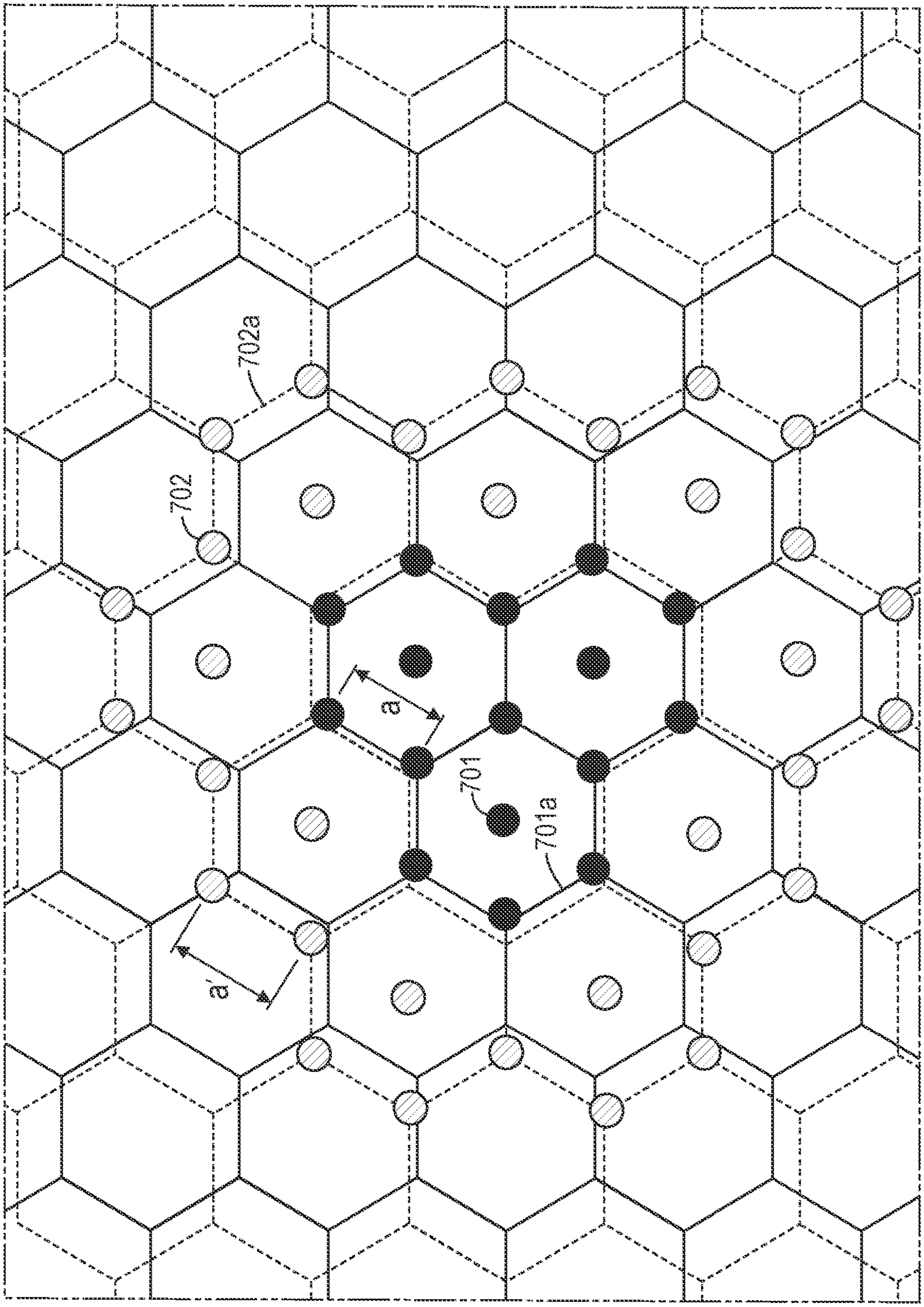
FIG. 7 shows a transition of an InGaN lattice characterized by a lattice parameter "a" similar to that of GaN (solid circles) to a larger, relaxed InGaN lattice characterized by a lattice parameter "a" (hashed circles).

FIG. 7 shows a conceptual plan view cross-section of a patterned GaN seed material with lattice parameter a, with side surfaces upon which lateral heteroepitaxy is performed for the growth of an InGaN layer which is allowed to relax via twist to the relaxed lattice parameter a'. For sufficiently small dimensions, deformation is completely elastic, and no defects are formed. For larger dimension, some plastic deformation may occur but may be tolerable provided the final defect-density in subsequently deposited, overlying semiconductor layers is sufficiently low. For example, it is desirable that the extended defect densities in the subsequently deposited semiconductor layers be less than 5E9 $cm^2$, such as less than 5E8 $cm^2$, or less than 5E7 $cm^2$. The lateral InGaN growth and coalescence methods provided by the present disclosure facilitates the annihilation of threading dislocation in III-nitride materials.

Further control over thickness and compositional uniformity of the relaxed InGaN growth may be provided by growing multilayer structures, rather than using bulk InGaN layers. For example, a 25% bulk InGaN layer may be replaced, for example, by alternating layers of 3 nm GaN and 1 nm InN, or 2 nm GaN and 2 nm $In_{0.5}Ga_{0.5}N$. Layer thicknesses for the individual layers can range, for example, from 0.5 nm to 100 nm, such as from 1 nm to 30 nm. Multiplayer structures are not limited to the base layer but may be used throughout the epitaxial stack including the semiconductor device layers such as n-type, p-type and active layers overlying the relaxed InGaN layer, or in layers between the relaxed InGaN base layer and the device layers.

The increased lattice parameter of the relaxed InGaN layer compared to that of InGaN/GaN allows for growth of subsequently deposited semiconductor layers at much higher temperatures than for InGaN/GaN. For example, InGaN with an a-lattice parameter of 3.205 Å has been shown to incorporate about 7% InN, compared to about 4% for InGaN/GaN. Because InN mole fraction incorporation into GaN is inversely proportional to growth temperature in MOCVD, this suggests that an InGaN a-lattice parameter increase of about 0.015 to 0.020 can increase the useful growth temperature by about 50° C. Further increases in InGaN a-lattice parameter will allow even higher temperatures to be used for the same InN mole fraction. This effect can be exploited not only in the realization of higher quality semiconductor layers grown on relaxed InGaN achieved by reduced point-defect formation at higher temperatures, but also by the reduction or elimination of pits that occur at the location of threading dislocations in the surfaces of InGaN films. Ideally, the growth temperature of the InGaN layers is kept sufficiently high to eliminate or at least restrict the pits to diameters much less than 1 μm, such as less than 200 nm, or less than 50 nm. Small pits can be "filled" using thin, high-temperature GaN or AlGaN layers grown over the pitted InGaN films.

Methods provided by the present disclosure can include recursion, which may be helpful in obtaining large lattice parameter changes. For example, a relaxed InGaN layer may be used as a seed layer, to provide seed surfaces for growth of higher-InN mole fraction layers. The resulting, new relaxed InGaN layer, could then be used as a seed layer in another turn of the process, and so on. This approach may be helpful in obtaining relaxed InGaN layers with very high InN mole fractions, which may be suitable as base layers for the growth of active semiconductive layers for emitting at long wavelengths, such as beyond red, to deep red and even infra-red emission, for example at wavelengths within a range from 700 nm to 1.6 μm.

A relaxed InGaN layer provided by the present disclosure can serve as a template for and/or supporting structure for growing optical and/or electrical devices. Very large area wafers are possible, including 150 mm, 200 mm or larger diameter wafers, which facilitates high volume, low cost manufacturing of these devices.

Figure 8:
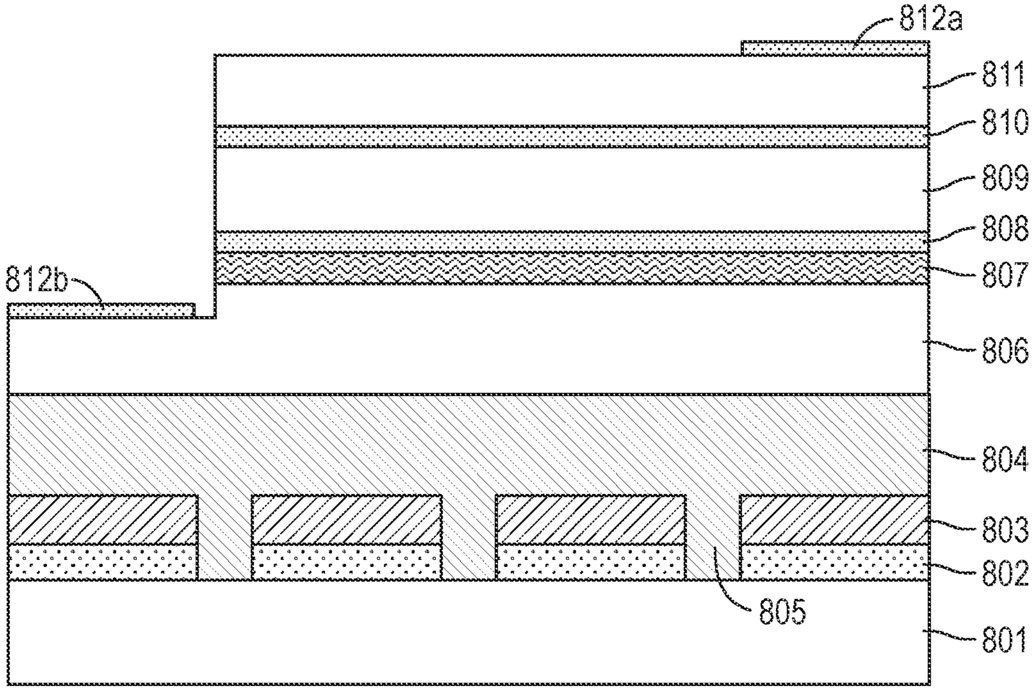
FIG. 8 shows an example of an LED incorporating a III-nitride semiconductor structure provided by the present disclosure.

As an example, FIG. 8, shows an LED structure formed by growing an n-type layer 806 (doped with Si or Ge, for example) above the relaxed InGaN surface of InGaN layer 804, followed by an InGaN-containing active region 807, an optional p-type electron blocking layer 808 comprising, for example, GaN, AlGaN, or InGaN (or multi-layers comprising these alloys), then a p-type layer 809 such as a p-type GaN or InGaN layer. A highly doped, e.g., Mg-doped, p-type contact layer 810 comprising, for example, GaN or InGaN overlies p-type layer 809 and provides for an Ohmic contact to the device on the p-side. As shown in FIG. 8 the semiconductor structure underlying the InGaN layer 804 includes substrate 801, GaN seed regions 802, and mask regions 803. To the extent there is refractive index contrast between these various features, their presence can help improve light extraction from the device. The resulting semiconductor wafer can undergo a series of process steps such as lithography, etching, and semiconductor deposition to form isolated LED areas with suitable electrical contact materials to the n- and p-type layers. Such contact materials can include those with suitable optical characteristics such as high optical reflectively and or transparency. Electrode metallizations 812*a* (e.g., NiAg, NiAu, TiAlCrNiAu, etc.) and 812*b* (e.g., TiAl, TiAlCrNiAu, etc.) can be deposited and patterned to provide electrical connection, for example, using wirebonds. Various transparent conducting oxide (TCO) materials (not shown) such as indium-tin-oxide (ITO) can be used to facilitate a current spreading layer 811, especially for resistive p-type layers. After fabrication of the semiconductor structure, the wafers can be diced to provide individual devices capable of being mounted into suitable packages by various means, including epoxy die-attach or soldering, among others. Electrical contact can be made to the p- and n-type layers, for example, using wire bonds, to form a functioning device, to which electrical power can be eventually supplied. The devices can further include luminescent down-conversion materials, and/or encapsulation materials such as silicone, to provide desirable optical output characteristics, including white light for illumination applications. The devices may be employed in a system for illumination and/or in a display application.

As shown in FIGS. 9A-9D, various flip-chip (FC) LED architectures are possible, including (a) standard, (b) thin-film flip-chip (TFFC) wherein the initial growth substrate has been removed, but the mask and seed layer portions retained, (c) TFFC with mask and seed layer portions removed, and (d) TFFC with mask and seed layer portions removed and the exposed InGaN layer textured (for light extraction purposes), such as by photolithographic and/or chemical-based etching techniques.

Figure 9A:
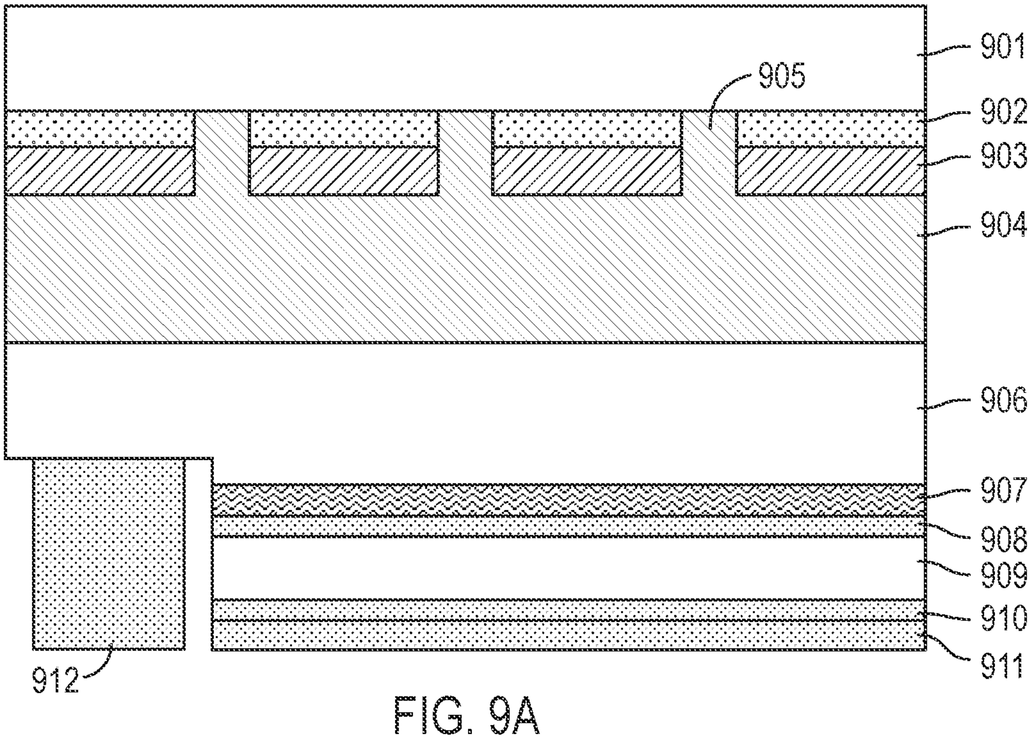
FIGS. 9A-9D show examples of LEDs incorporating a III-nitride semiconductor structure provided by the present disclosure.
Figure 9B:
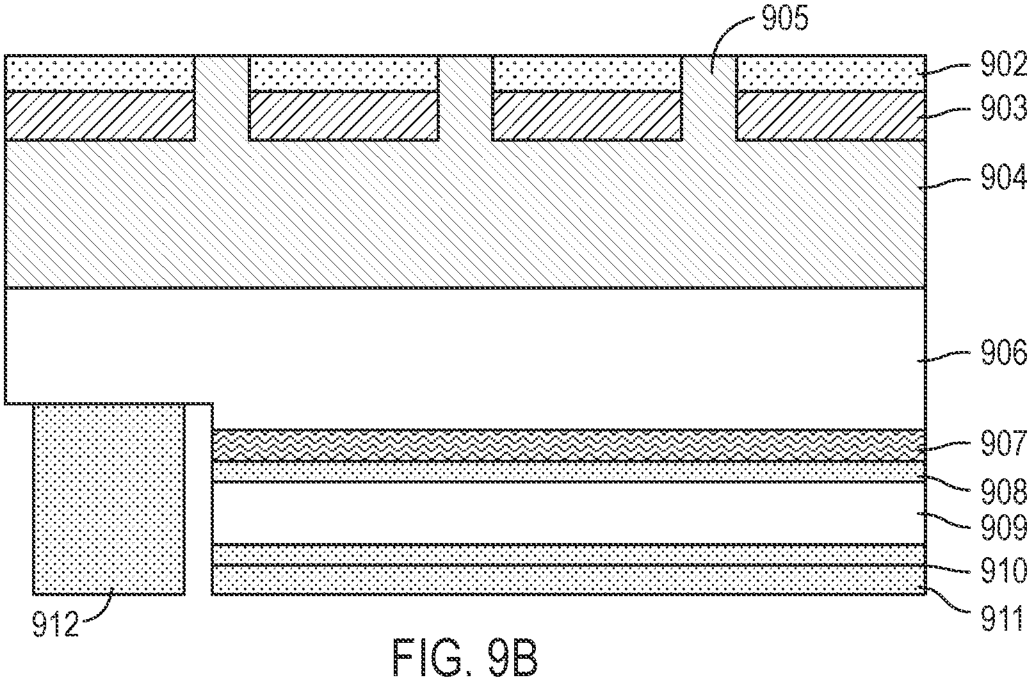
Figure 9C:
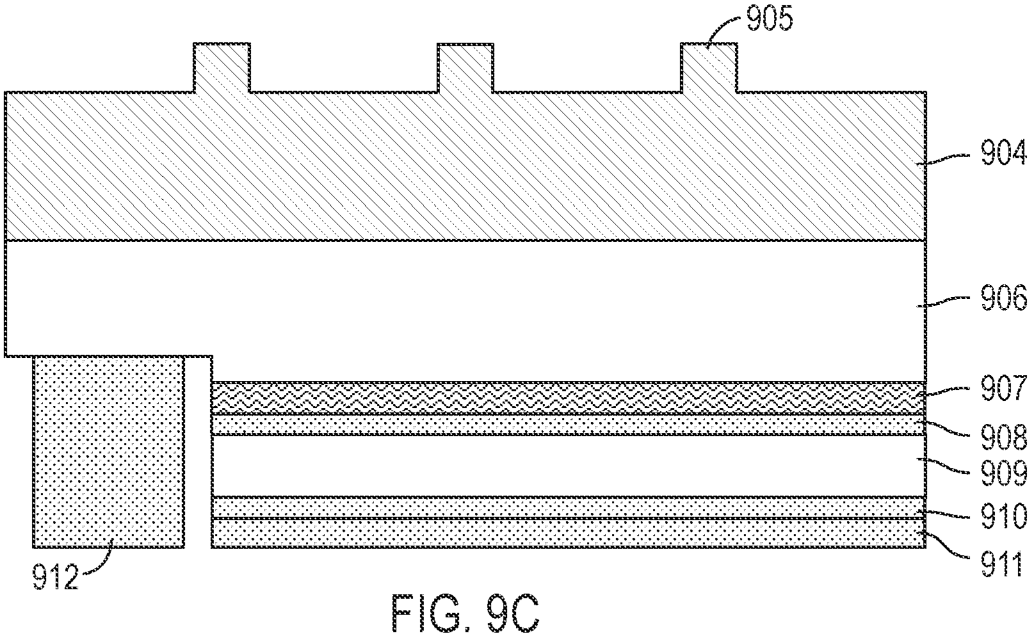
Figure 9D:
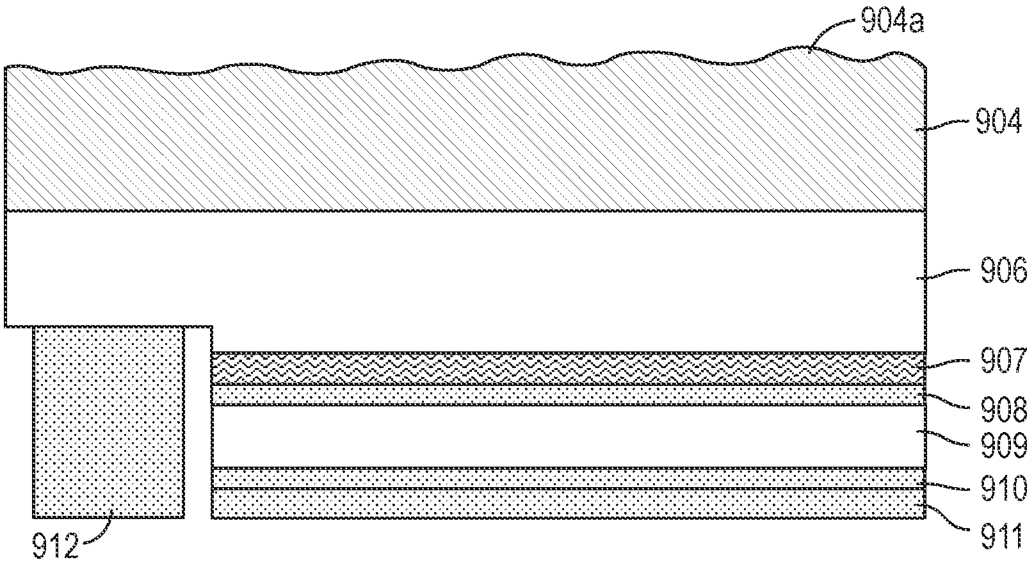

The semiconductor structures shown in FIGS. 9A-9D include substrate 901, seed region 902, mask regions 903, relaxed InGaN layer 904 and initial InGaN growth region 905, n-type layer 906, InGaN-containing active region 907, optional p-type electron blocking layer structure 908, p-type layer 909, p-type contact layer 910, p-side electrode metallization 911, and n-side electrode metallization 912. In FIG. 9B, the substrate has been removed, in FIG. 9C the growth regions and mask regions have been removed, and in FIG. 9D a portion of the relaxed InGaN region 904 has been removed and/or roughened 904*a* to enhance, for example, certain optical characteristics of the device.

Figure 10:
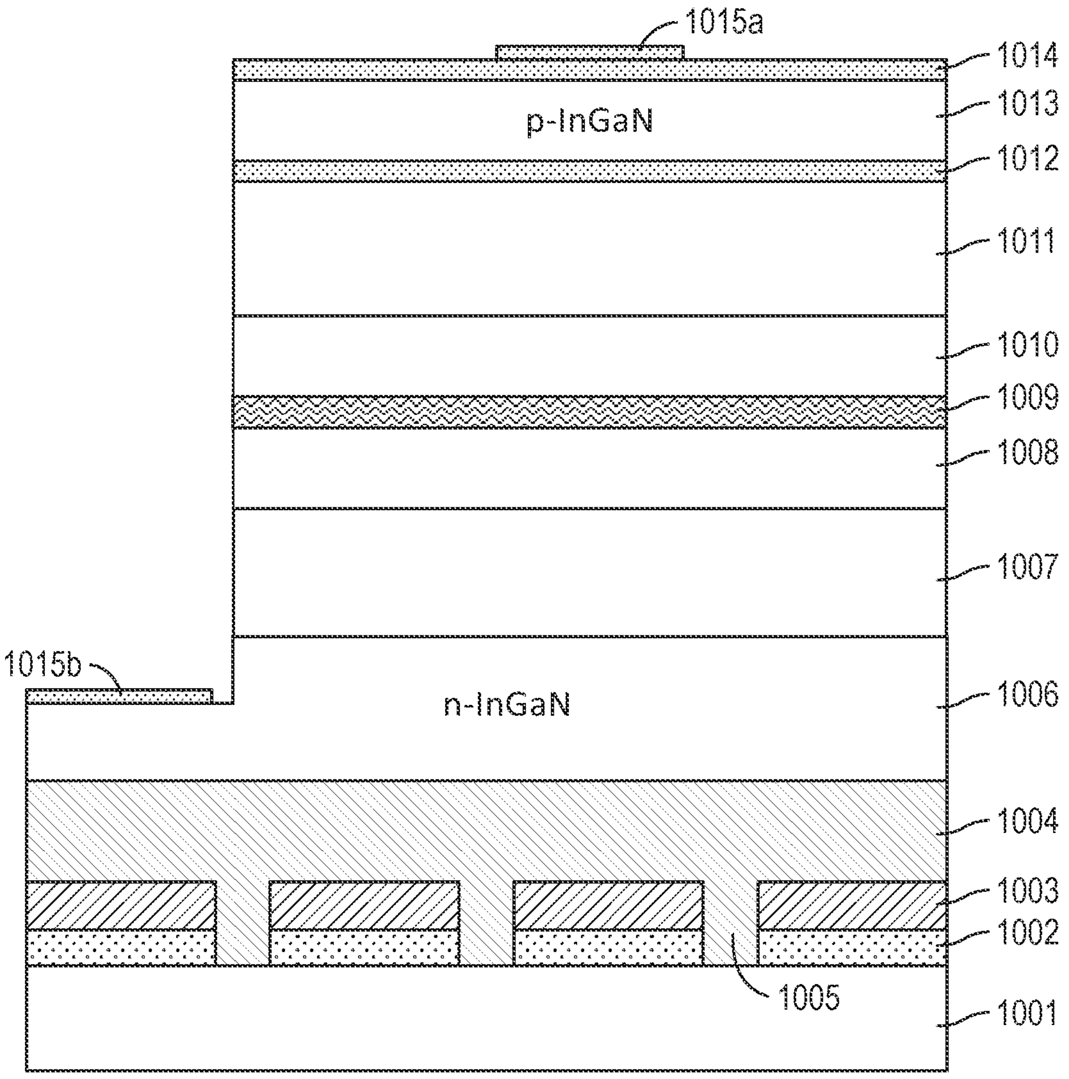
FIG. 10 shows an example of a laser diode (LD) incorporating a III-nitride semiconductor structure provided by the present disclosure.

FIG. 10 shows a laser diode structure grown over a relaxed InGaN layer. As shown in FIG. 10, relaxed InGaN layer 1004 including initial InGaN regions 1005 overlies mask regions 1003, seed regions 1002, and substrate 1001. The laser diode can be formed by growing an n-type optical confining ("cladding") layer 1007 over the relaxed InGaN material 1004 and an n-type contact layer 1006, and then growing an InGaN-based active region including a waveguide region comprising waveguide layers 1008 and 1010 on either side of an InGaN-containing active layer 1009), and subsequently growing a p-type optical confining ("cladding") layer 1011. Layer 1012 and layer 1013 overlie p-cladding layer(s) 1011. Wafer fabrication for laser diodes is similar to that for LEDs except that the devices are formed into stripes to form laser cavities. After dicing and the formation of etched or cleaved mirror facets, high-reflection and anti-reflection dielectric coatings can be deposited on the rear, and front facets, respectively (not shown). The laser diodes can be mounted, either epi-side down or substrate side down, depending on material choices and application details, into suitable packages. Electrical contact can be made to highly doped p-type contact layer 1014 and n-type contact layer 1006 via electrode metallizations 1015*a* and 1015*b*, respectively, to form a functioning device, to which electrical power can be supplied. The laser diodes be employed in a system for illumination and/or in a display application.

Figure 11:
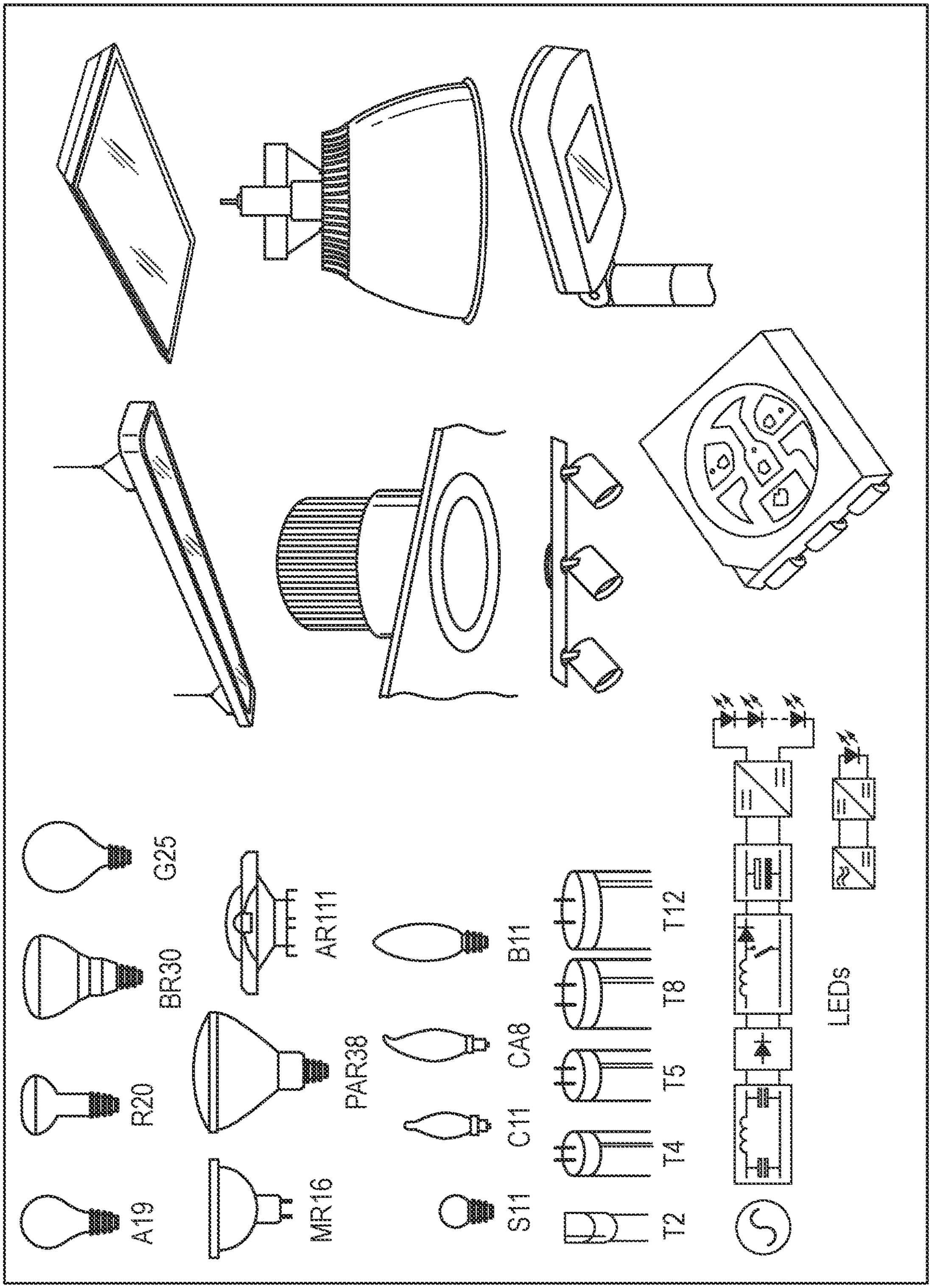
FIG. 11 shows examples of lighting devices and systems in which LEDs provided by the present disclosure can be incorporated.
Figure 12:
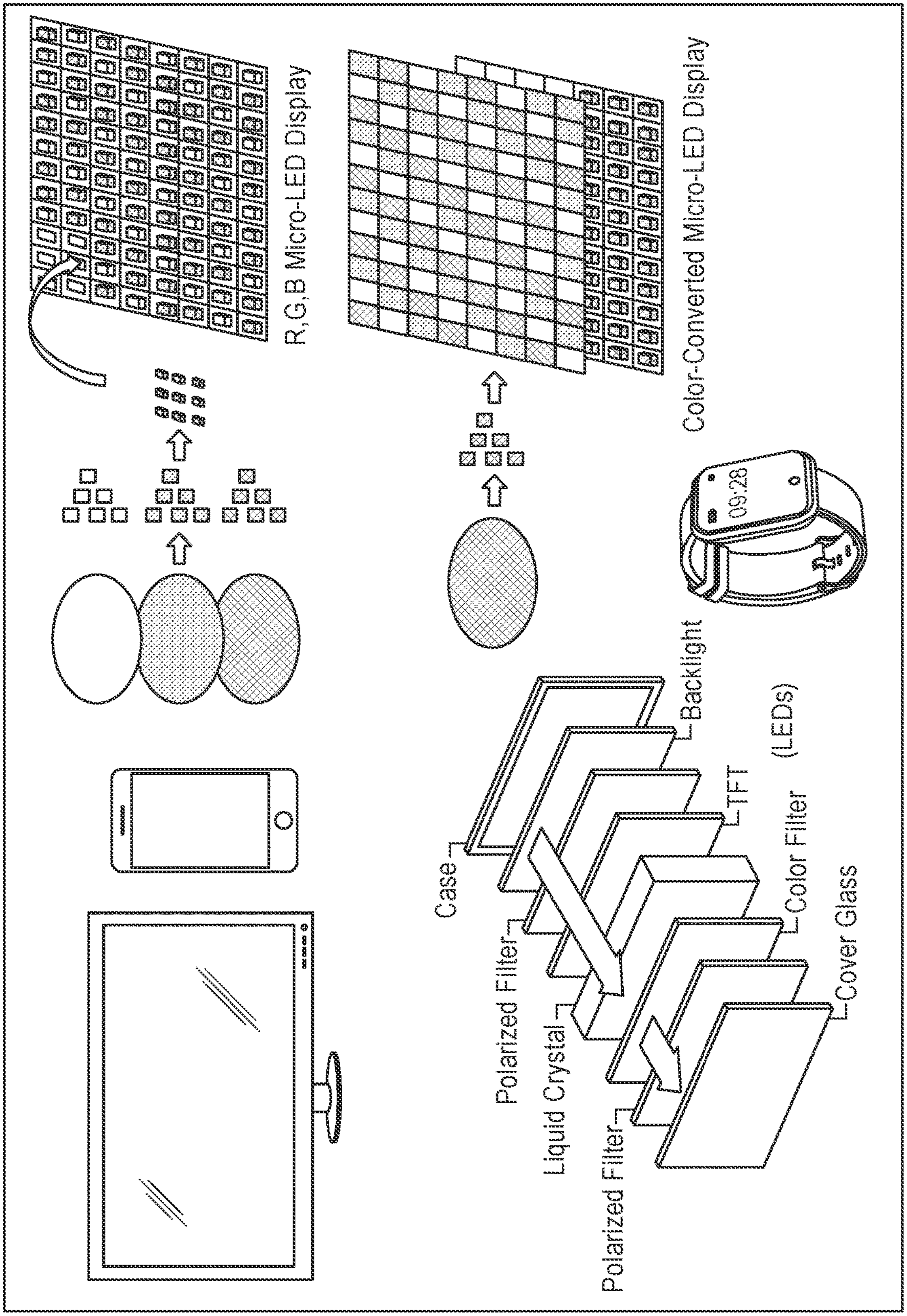
FIG. 12 shows examples of display devices and systems in which LEDs provided by the present disclosure can be incorporated.

Relaxed InGaN layers provided by the present disclosure are applicable to a wide range of compound semiconductor devices which impact the performance of a wide range of system solutions for various applications, including lighting devices and systems (FIG. 11) and display devices and systems (FIG. 12).

Target compositions for the a relaxed InGaN layer can be selected according to intended device, application, and performance requirements. For conventional InGaN light-emitting diodes lattice-matched to GaN, the best performing devices are those emitting in the violet wavelength range. At these wavelengths, the strain state of InGaN quantum wells with respect to the GaN base layers is from about 1% to 2%. The corresponding compositional differences are sufficiently high such that bandgap engineering can provide very high quantum efficiency devices, while the strain state is sufficiently low to allow for relatively thick InGaN quantum well (QW) layers which serve to reduce carrier density and mitigate non-radiative Auger recombination (aka "droop"). Applying this acceptable range of strain states to other emission wavelengths, preferred compositional ranges for relaxed InGaN base layers provided by the present disclosure can be calculated for a wide range of emitters, from blue (about 450 nm) to the infra-red (about 1.3 μm) wavelengths. The preferred ranges are listed in Tables 1 and 2.

TABLE 1

Preferred ranges of InN mole fraction of relaxed InGaN (0001) base layers for light-emitting diodes and laser diodes according to emission color (PWL = peak wavelength in nm, Eg = bandgap in eV, a_base = base layer in-plane a-lattice parameter at 300K in Å, a_QW = quantum well layer in-plane a-lattice parameter at 300K in Å).

| | Violet | Blue | | Green | | Amber | | Red | |
|---|---|---|---|---|---|---|---|---|---|
| base InN % | 0% | 2% | 7% | 13% | 18% | 20% | 26% | 26% | 30% |
| a_base | 3.189 | 3.196 | 3.214 | 3.235 | 3.253 | 3.260 | 3.282 | 3.282 | 3.296 |
| PWL | 405 | 440 | | 520 | | 580 | | 620 | |
| Eg | 3.06 | 2.82 | | 2.38 | | 2.14 | | 2.00 | |
| a_QW | 3.22104 | 3.24596 | | 3.28868 | | 3.31716 | | 3.3314 | |
| QW InN % | 9% | 16% | | 28% | | 36% | | 40% | |
| strain % | 1.00% | 1.56% | 1.00% | 1.65% | 1.09% | 1.75% | 1.08% | 1.52% | 1.08% |
| PWL | 420 | 460 | | 540 | | 600 | | 640 | |
| Eg | 2.95 | 2.70 | | 2.30 | | 2.07 | | 1.94 | |
| a_QW | 3.23172 | 3.25664 | | 3.29936 | | 3.32428 | | 3.34208 | |
| QW InN % | 12% | 19% | | 31% | | 38% | | 43% | |
| strain % | 1.34% | 1.89% | 1.33% | 1.98% | 1.42% | 1.97% | 1.30% | 1.84% | 1.40% |

TABLE 2

Preferred ranges of InN mole fraction of relaxed InGaN (0001) base layers for light-emitting diodes and laser diodes according to emission color (PWL = peak wavelength in nm, Eg = bandgap in eV, a_base = base layer in-plane a-lattice parameter at 300K in Å, a_QW = quantum well layer in-plane a-lattice parameter at 300K in Å).

| | "700 nm" | | "850 nm" | | "980 nm" | | "1300 nm" | |
|---|---|---|---|---|---|---|---|---|
| base InN % | 32% | 38% | 44% | 50% | 52% | 57% | 69% | 75% |
| a_base | 3.303 | 3.324 | 3.346 | 3.367 | 3.374 | 3.392 | 3.435 | 3.456 |
| PWL | 690 | | 840 | | 940 | | 1300 | |
| Eg | 1.80 | | 1.48 | | 1.32 | | 0.95 | |
| a_QW | 3.35988 | | 3.4026 | | 3.42752 | | 3.49516 | |
| QW InN % | 48% | | 60% | | 67% | | 86% | |
| strain % | 1.72% | 1.07% | 1.70% | 1.06% | 1.58% | 1.05% | 1.76% | 1.13% |
| PWL | 710 | | 870 | | 980 | | 1350 | |
| Eg | 1.75 | | 1.43 | | 1.27 | | 0.92 | |
| a_QW | 3.367 | | 3.40972 | | 3.4382 | | 3.50228 | |
| QW InN % | 50% | | 62% | | 70% | | 88% | |
| strain % | 1.94% | 1.29% | 1.92% | 1.27% | 1.90% | 1.36% | 1.97% | 1.34% |

Figure 14A:
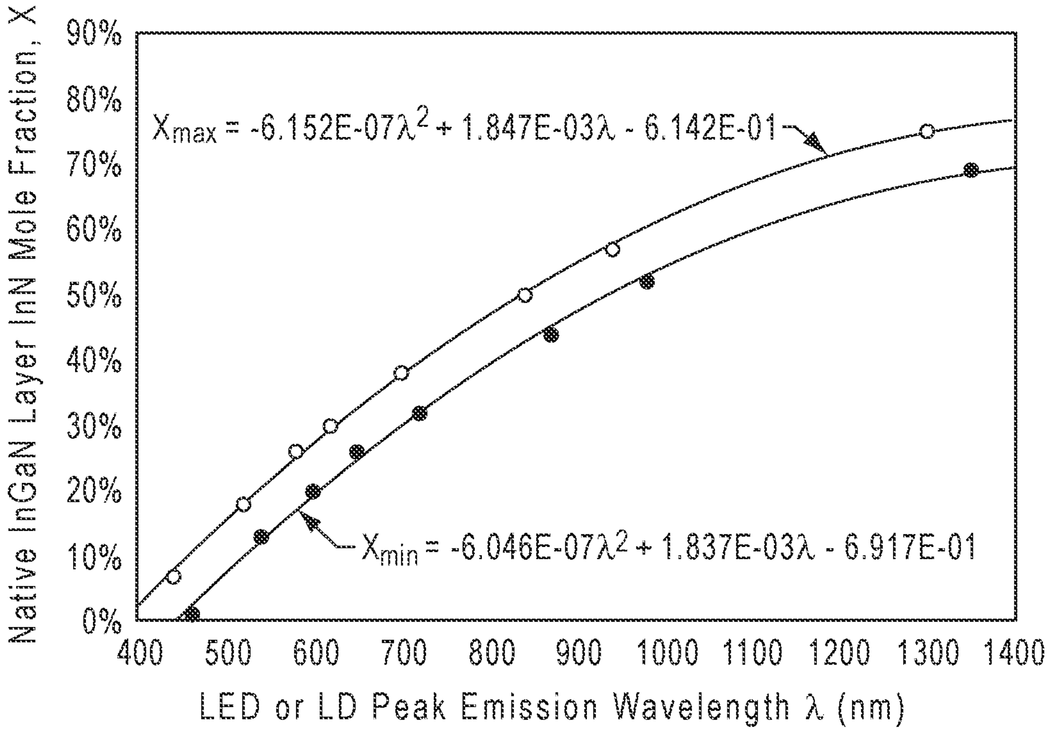
FIGS. 14A-14B show ranges of InN molar fractions and a-lattice parameters, respectively, for (0001) relaxed InGaN regions according to peak emission wavelength.
Figure 14B:
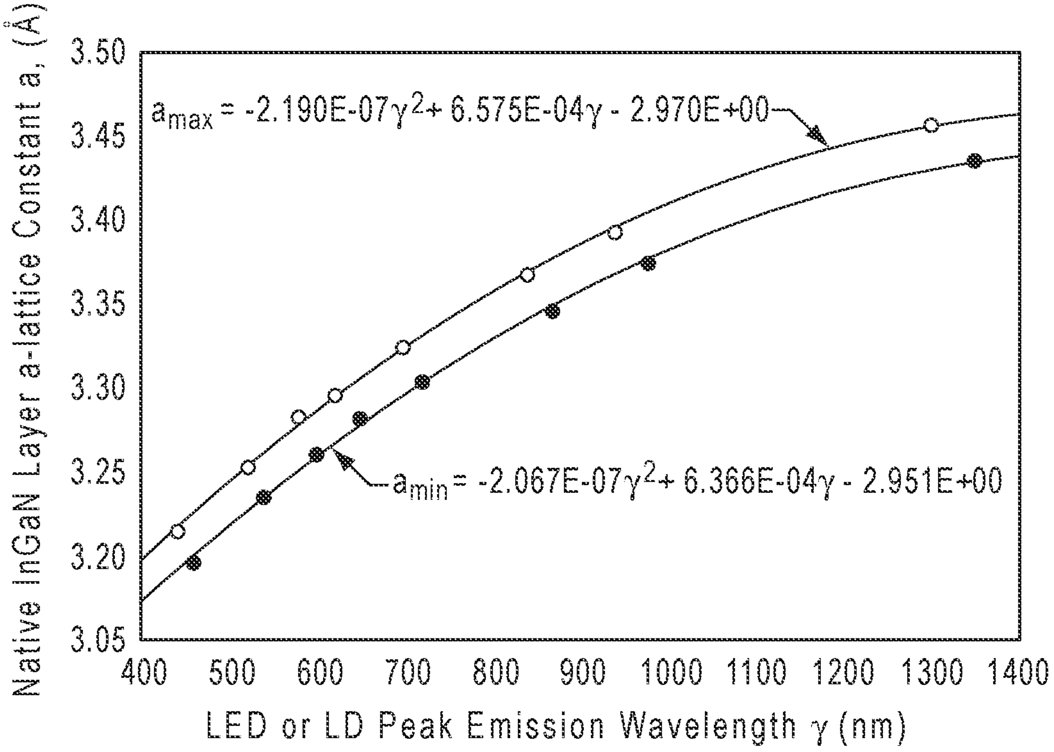

FIGS. 14A and 14B graphically illustrate the preferred ranges of InN molar fractions, and a-lattice parameters, for (0001) relaxed InGaN layers for use as templates for fabricating light emitting diodes and laser diodes, according to peak emission wavelength, consistent with the parameters presented in Tables 1 and 2. For example, as a function of peak emission wavelength, λ, the InN molar fraction, x, for a relaxed $In_xGa_{1-x}N$ base layer should satisfy the condition $x_{min} \leq x \leq x_{max}$, where $X_{min}$ and $X_{max}$ are defined by EQN. 1 and EQN. 2, respectively:

$$x_{min}=-6.046E\text{-}07\lambda^2+1.837E\text{-}03\lambda-6.917E\text{-}01,(\lambda\geq 440\text{ nm}) \quad \text{EQN. 1}$$

$$x_{max}=-6.152E\text{-}07+^2+1.847E\text{-}03\lambda-6.142E\text{-}01,(\lambda\geq 440\text{ nm}) \quad \text{EQN. 2}$$

Similarly, as a function of peak emission wavelength, λ, the in-plane ("a") lattice parameter, a, for a relaxed $In_xGa_{1-x}N$ base layer should satisfy the condition $a_{min} \leq a \leq a_{max}$, where $a_{min}$ and $a_{max}$ are defined by EQN. 3 and EQN. 4, respectively:

$$a_{min}=-2.067E\text{-}07\lambda^2+6.366E\text{-}04\lambda-2.951,(\lambda\geq 440\text{ nm}) \quad \text{EQN. 3}$$

$$a_{max}=-2.190E\text{-}07\lambda^2+6.575E\text{-}04\lambda-2.970,(\lambda\geq 440\text{ nm}) \quad \text{EQN. 4}$$

Methods and semiconductor structures provided by the present disclosure can be adapted to fabricate Vertical Cavity Surface Emitting Layers (VCSELs). The compositional choices for relaxed InGaN base layers for LDs or VCSELs are similar to those for LEDs and are shown in Tables 1 and 2.

Figure 15A:
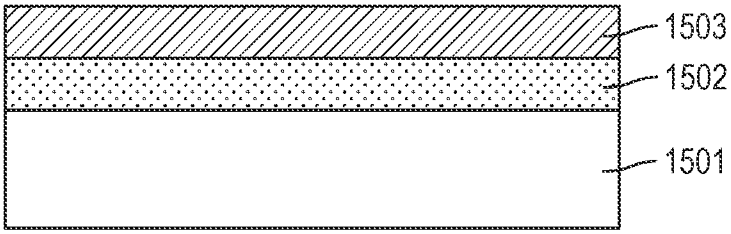
FIGS. 15A-15F show an example of process flows for fabricating an InGaN layer provided by the present disclosure.
Figure 15B:
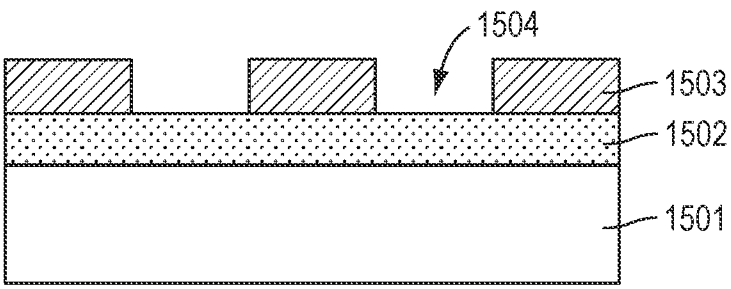
Figure 15C:
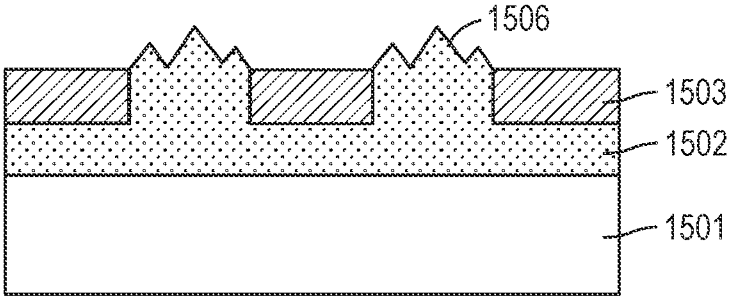
Figure 15D:
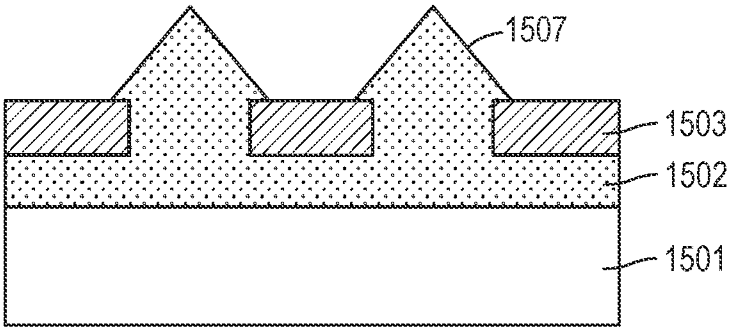
Figure 15E:
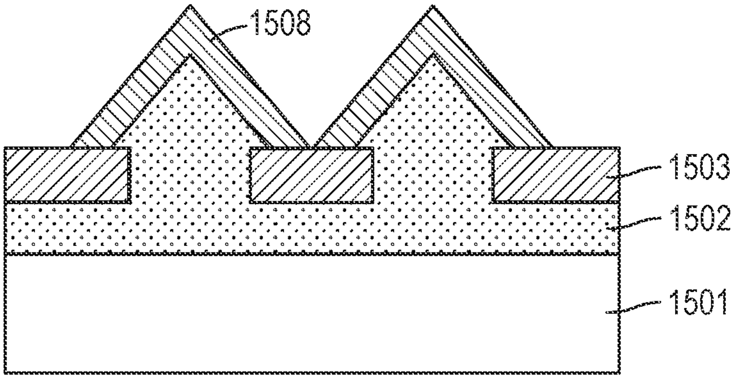
Figure 15F:
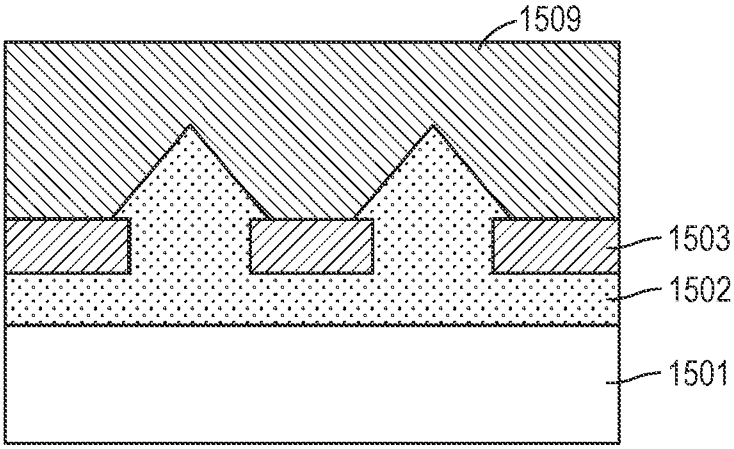

FIGS. 15A-15F show a method for fabricating relaxed InGaN layers on faceted GaN seed region edge surfaces. In this method, a (0001) GaN or MN seed layer 1502 on a substrate 1501 is provided. FIG. 15A shows substrate 1501, overlying seed layer 1502, and overlying mask layer 1503. The GaN seed layer can be, for example, less than 3 μm thick, less than 0.3 μtm thick, or less than 0.03 μm thick. Referring to the process flow illustrated in FIGS. 15A-15F, the seed layer 1502 can be overcoated with a masking layer 1503 comprising a material that is slow to promote GaN nucleation. The masking layer 1503 can be patterned and etched using any suitable photolithography including nanolithography and etching techniques (wet, or dry, or a combination thereof) into various patterns described above. The exposed GaN in the openings in the mask 1504 created by etching can then be used to nucleate a GaN seed material 1506, which as shown in FIGS. 15C and 15D can be grown out from the openings in the mask and by proper selection of growth conditions, allowed to form seed regions with edges that are, for example, triangular facets with hexagonal bases. For example, the structures may be six sided with a hexagonal base and have triangular facets that are {1-101} equivalent planes. Once the facets are fully formed as shown in FIG. 15D, the triangular facet surfaces 1507 can be used as seed surfaces for at least lateral growth of InGaN, forming heterojunctions that are not co-planar with the substrate surface. The small dimensions of the GaN seed surfaces (facets) and choice of InGaN target composition promote relaxation of the overgrown InGaN as the InGaN thickness increases, while providing a flat, crystallographically equivalent orientations to ensure coherency. The InGaN 1508 grows coherently and relaxes toward its relaxed lattice parameter, to form hexagonal structures with triangular facets that are relaxed InGaN as shown in FIG. 15E. These InGaN facets can be further grown out and can eventually coalesce with neighboring InGaN growth fronts of other planar seed facets. As shown in FIG. 15F, the coalesced InGaN then grows above the masking layer and seed regions, and growth conditions (e.g., growth temperature and TMI flow) are selected to form a continuous, planar, relaxed InGaN layer or template 1509 as an upper region of the structure. This method has the advantage that no etching of GaN (or InGaN, AlGaN or MN) seed material is required to provide seed surface portions for the nucleation of InGaN. Furthermore, this method is very suitable when the growth substrate is a III-nitride material, such as a GaN or MN substrate. As such, this method facilitates the fabrication of LD devices, wherein low dislocation densities (e.g., less than 5E7 $cm^{-2}$ for a GaN substrate) are preferred for long-life operation (>10,000 hours).

Figure 16A:
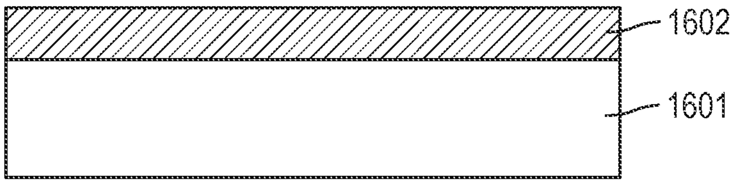
FIGS. 16A-16F show an example of process flows for fabricating an InGaN layer provided by the present disclosure.
Figure 16B:
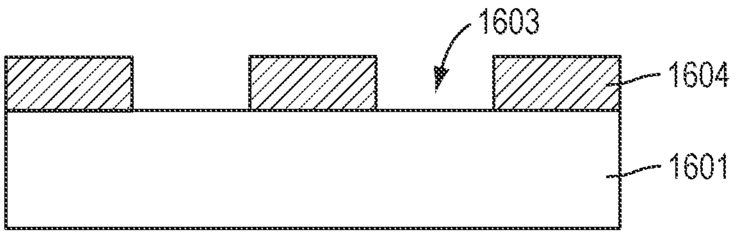
Figure 16C:
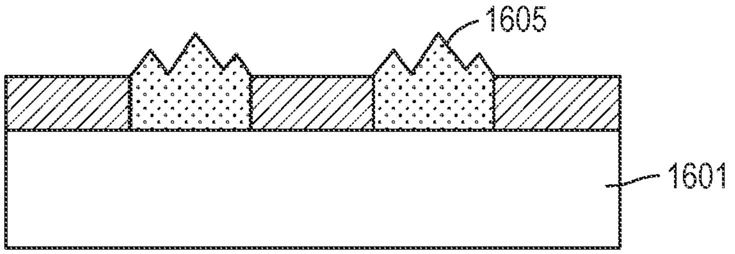
Figure 16D:
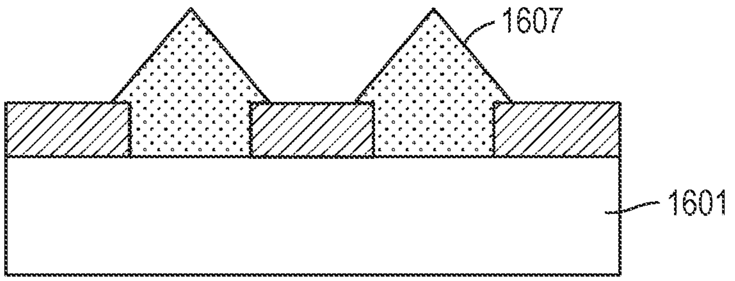
Figure 16E:
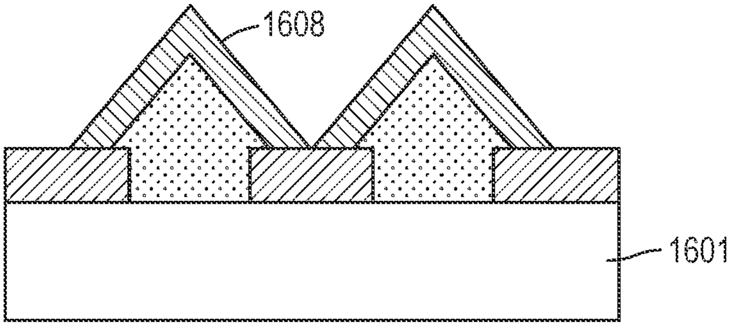
Figure 16F:
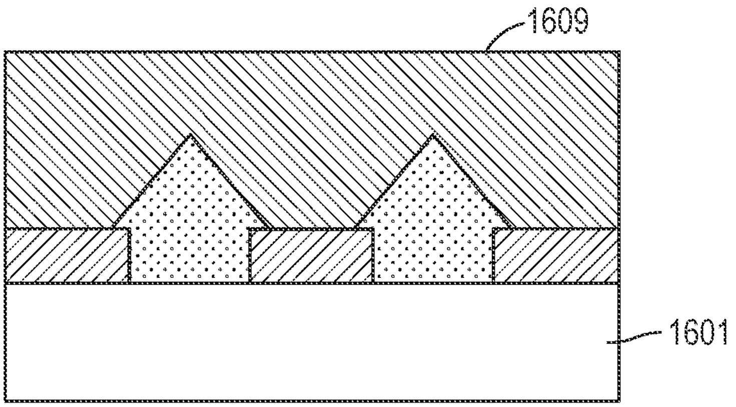

FIGS. 16A-16F show another method for fabricating relaxed InGaN layers on faceted GaN surfaces. This method is similar to the method illustrated in FIGS. 15A-15F except that the GaN seed material is nucleated on the substrate. In this approach, a substrate 1601 suitable for GaN nucleation can be provided such as sapphire, SiC, sapphire, MN or GaN. Referring to FIG. 16A, the substrate 1601 can be overcoated with a masking layer 1602 of a material that is slow to promote GaN nucleation. As shown in FIG. 16B the masking layer 1602 is patterned and etched using photolithography such as nano-lithography and etching techniques (wet, or dry, or a combination thereof) into various patterns 1604. The exposed substrate 1603 in the openings in the mask created by etching can then be used to nucleate GaN seed material 1605 as shown in FIG. 16C, which is grown out from the openings in the mask and, by proper selection of growth conditions, allowed to form GaN seed regions with edges that are triangular facets and have a hexagonal base. For example, the seed region may be six sided and have triangular facets that are {1-101} crystallographically equivalent planes. As shown in FIG. 16D, after the seed regions are fully formed, the triangular facet surfaces 1607 are used as seed surfaces for at least lateral growth of InGaN, forming six heterojunctions in crystallographically equivalent planes that are not co-planar with the substrate. The small dimensions of the GaN seed surfaces and choice of target composition of the grown InGaN material promote relaxation of the InGaN grown on the seed surfaces. Furthermore, each seed surface provides flat, crystallographically equivalent orientations to ensure coherency throughout the grown out InGaN material. The InGaN grows coherently and relaxes towards its relaxed lattice parameter, to form facets 1608 that are relaxed InGaN as shown in FIG. 16E. These facets are further grown out and eventually coalesce with neighboring InGaN growth fronts grown from other seed regions. As shown in FIG. 16F, the coalesced InGaN then grows above the masking layer, and growth conditions (e.g., growth temperature and TMI flow) are selected to form a continuous, planar, relaxed InGaN region 1609 or template across the substrate. This method has the advantage that no etching of GaN (or MN) material is required to provide seed surfaces for the nucleation of InGaN. The method also has the advantage that the entire process can be provided in a single epitaxial growth process. Furthermore, this method is very suitable when the growth substrate is a III-nitride material, such as a GaN or MN substrate.

Figure 17A:
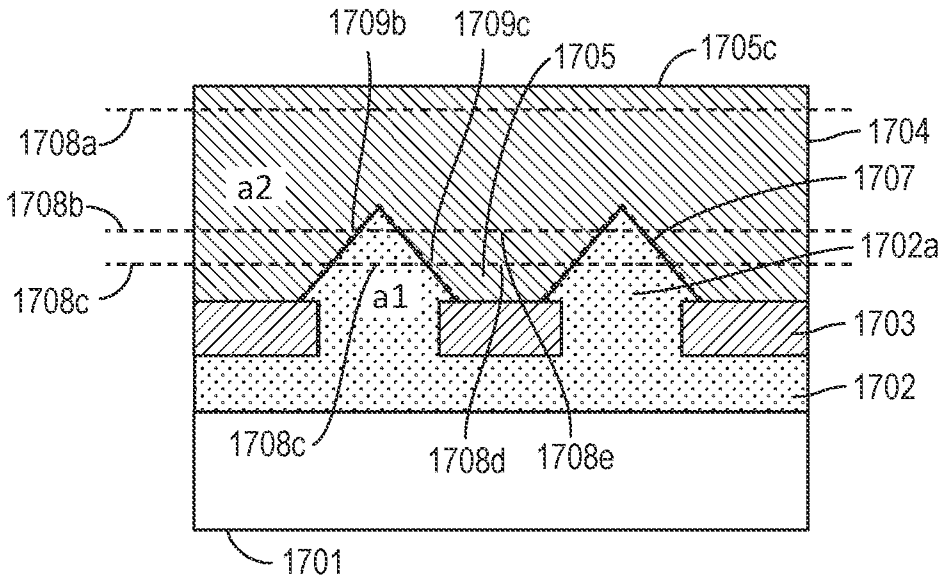
FIGS. 17A and 17B show a cross-sectional view of examples of a III-nitride semiconductor structure provided by the present disclosure.

FIG. 17A provides a detailed cross-sectional view of a structure resulting from the process flow in FIGS. 15A-15F. A substrate 1701, such as (0001) sapphire serves as a primary growth substrate for GaN (or InGaN, AlGaN, or MN) seed layer 1702, characterized by in-plane a-lattice parameter a1. The GaN seed layer 1702 has been grown out between masked regions 1703, to form GaN seed regions 1702*a*, which have exposed edges of planar GaN seed surfaces that are crystallographically equivalent. InGaN material has been nucleated on the triangular GaN seed surfaces of the GaN seed region, forming heterojunctions 1707 which are not parallel to the primary surface of the original growth substrate 1701. Heterojunctions 1707 may be formed on stable crystallographically equivalent facets of the GaN seed region, such as on the {1-101} crystallographically equivalent facets. The InGaN material been grown out, at least partially laterally, in order to relax towards a relaxed InGaN in-plane a-lattice parameter a2, in regions 1705 between GaN seed surfaces. A plane 1708*b* parallel to the primary surface of the original growth substrate, and bisecting the GaN seed material, is characterized by different in-plane a-lattice parameters at different positions along the plane. In particular at a center point within the GaN seed regions 1702*a*, it is characterized by a lattice parameter a1, and at a center point 1705 between GaN seed regions 1702*a*, the lattice parameter is approximately a2. In GaN regions between these two center points, the in-plane a-lattice parameter is greater than a1 and less than a2, because a2>a1. In plan-view (not shown) the variation in the GaN in-plane a-lattice parameter within plane 1708*b* is characterized by the two-dimensional mask pattern that has been applied to the GaN seed layer material (see FIGS. 5 and 6).

Figure 17B:
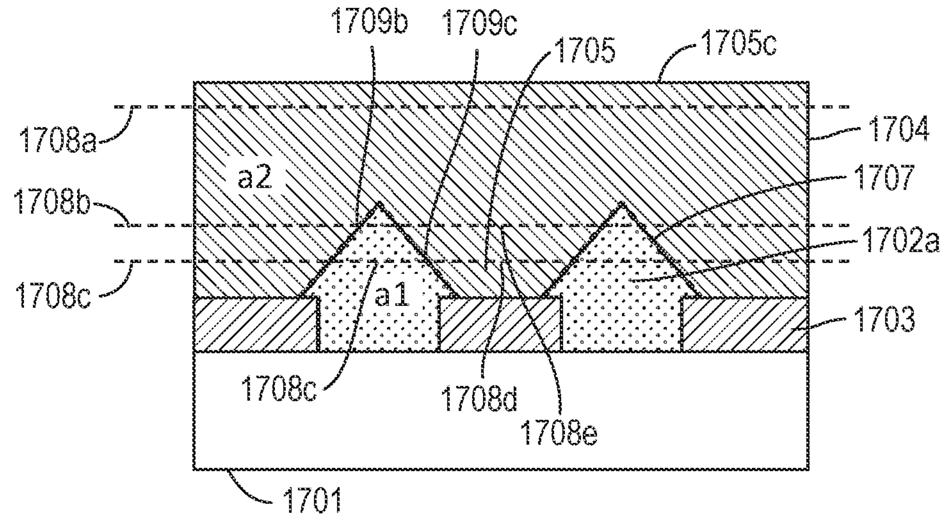

As shown in FIGS. 17A and 17B, plane 1708*b* intersects an edge of seed regions 1702*a* to locate a heterojunction 1709*b* at the interface between the InGaN region 1704 and the seed region. The heterojunction is coplanar with a first crystallographic plane of the seed region. Any plane such plane 1708*b* which is parallel to the primary growth surface and intersects both the InGaN region (such as 1708*c*) and seed regions 1702*a*, intersects an edge of a seed region 1702*a* to locate a heterojunction 1709*c* at the interface between the InGaN region and the seed region which is coplanar with a second crystallographic plane of the seed region. As shown in FIGS. 17A and 17B the first and second crystallographic planes are the same. The first and second crystallographic planes can be crystallographically equivalent crystallographic planes.

The InGaN material is coalesced above the masking layer 1703 to form a relaxed InGaN layer 1704 with planar surface 1705*c*. A plane 1708*a* parallel to the primary surface of the original growth substrate and positioned within InGaN layer 1704 near surface 1705*c* is predominantly characterized by an InGaN in-plane a-lattice parameter a2. At a center point 1705 between the GaN seed regions, the InGaN lattice parameter is a2, and at a center point within the GaN seed regions, the in-plane a-lattice parameter slightly less than a2. In plan-view (not shown) the variation in in-plane a-lattice parameter within plane 1708*b* is characterized by the two-dimensional mask pattern applied to the seed layer material (see FIGS. 5 and 6). Variations in in-plane a-lattice parameters are detectable by measurement techniques such as XRD and RSM and can be resolved at the sub-micrometer scale. A mid-point along plane 1708*b* within seed region 1702*a* is indicated as 1708*c* and a mid-point between seed regions 1702*a* is indicated as 1708*d*.

GaN seed regions 1702*a* can have in-plane dimensions, for example, less than 3 μm, less than 0.3 μm, or less than 0.03 μm. The height of GaN seed regions 1702*a* can be, for example, less than 3 μm, less than 0.3 μm, or less than 0.03 μm. The distances between neighboring GaN seed regions 1702*a* can be, for example, less than 3 μm, less than 0.3 μm, or less than 0.03 μm. The thickness of mask material 1703 can be, for example, from 0.01 μm to 1 μm. FIG. 17B provides a detailed cross-sectional view of a structure resulting from the process flow in FIGS. 16A-15F. This structure is similar to the structure of FIG. 17A, with similar elements identified the same way numerically. However, in the structure of FIG. 17B, there is no planar starting GaN (or MN) seed layer 1702. Instead, the GaN (or MN) seed material is nucleated directly on substrate 1701 in the opening between mask regions 1703. The substrate may be sapphire, GaN, MN, or silicon, among others.

A III-nitride semiconductor structure can comprise (a) seed regions comprising $In_xGa_{1-x}N$ ($0 \leq x < 1$) and a Wurtzite III-nitride crystal structure; (b) a first plane parallel to a (0001) plane of the Wurtzite III-nitride structure and intersecting the seed regions; wherein, an intersection of the first plane and a first edge of a seed region locates a $In_xGa_{1-x}N$/$In_yGa_{1-y}N$ heterojunction, wherein $0 < y \leq 1$ and $y > x$; and the $In_xGa_{1-x}N$/$In_yGa_{1-y}N$ heterojunction is coplanar with a first crystallographic plane of the seed region; (c) any second plane parallel to the (0001) plane of the Wurtzite III-nitride crystal structure and intersecting a second edge of the seed region locates a III-nitride heterojunction, wherein the III-nitride heterojunction is coplanar with a second crystallographic plane of the seed region; and (d) a (0001) InGaN region overlying the seed regions, wherein the (0001) InGaN region is characterized by an in-plane a-lattice parameter that is greater than 3.19 Å. wherein each of the first and second crystallographic planes is crystallographically equivalent.

The first parallel plane can intersect two facets of a seed region. The facets of the seed region are parallel to a crystallographic plane of the seed region, such as a crystallographic plane of a Wurtzite crystal structure. The facets of the seed region can be crystallographically equivalent facets. The intersection of the first parallel plane with a facet of the seed region locates a heterojunction such as a $In_xGa_{1-x}N$/$In_yGa_{1-y}N$ where $0 \leq x < 1$, $0 < y \leq 1$, and $y > x$.

Any second plane parallel to the 0001) plane of the Wurtzite III-nitride crystal structure and intersecting the seed regions locates a III-nitride heterojunction. The second plane can intersect the same facets as the first plane. The second plane can intersect facets of the seed regions that are coplanar with a crystallographic plane of the seed region. Each of the crystallographically planes can be a crystallographically equivalent plane. Each of the seed regions can be characterized by facets paralleled to crystallographic planes of the seed region such as crystallographic planes of a Wurtzite crystal structure. Each of the crystallographic planes can be crystallographically equivalent planes. Each of the crystallographic planes can be crystallographically equivalent to the {10-11} plane. Each of the crystallographic planes can be crystallographically equivalent to the {1-100} plane. Each of the crystallographic planes can be crystallographically equivalent to the {11-20} plane. Each of the crystallographic planes can be a (1-100) plane or a (11-20) plane.

An InGaN region is situated between the seed regions. The InGaN region, or at least a portion of the InGaN region between the seed regions can be a partially relaxed InGaN region. The InGaN region can comprise more than one InGaN layer where each of the InGaN layers has a different elemental composition. A (0001) InGaN region can overly the seed regions. The (0001) InGaN region can be a fully relaxed InGaN region and can have an in-plane a-lattice parameter that is greater than 3.19 Å, such from 3.20 Å to 3.50 Å.

A seed region can have 2 or more facets, such as 2, 3, 4, 5, or 6 facets. A seed region can have 3 or 6 facets. A seed region can have, for example, a rectangular base, a triangular base, a square base, a pentagonal base, or a hexagonal base. A seed region can have a triangular base or a hexagonal base.

Each seed region can comprise, for example, GaN, and can have, for example, a lattice parameter of about 3.189 Å. Each seed region can comprise GaN and each of the $In_xGa_{1-x}N$/$In_yGa_{1-y}N$ heterojunctions and the III-nitride heterojunctions is a GaN—InGaN heterojunction.

Figure 18C:
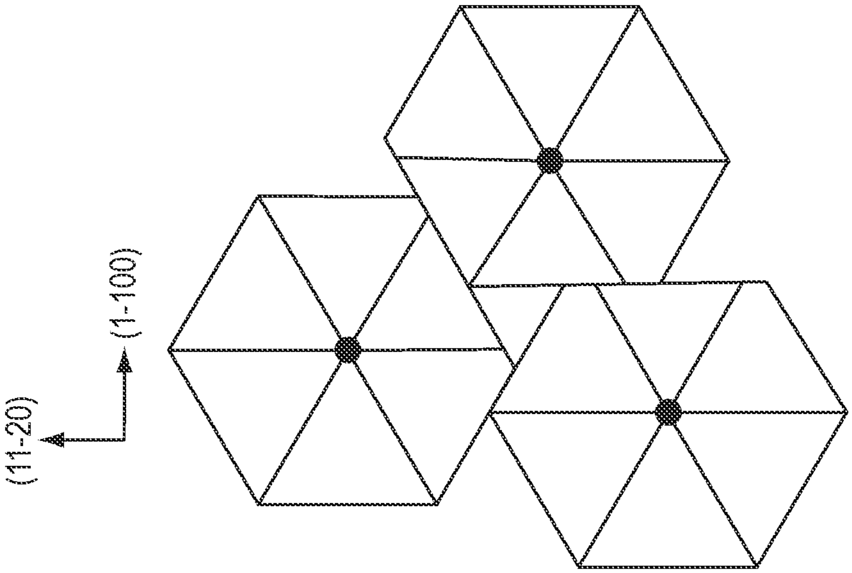
FIGS. 18A-18C show an example of the progressive growth of InGaN on (10-11) facets of a III-nitride semiconductor to fill in "v-pit" structures.
Figure 18B:
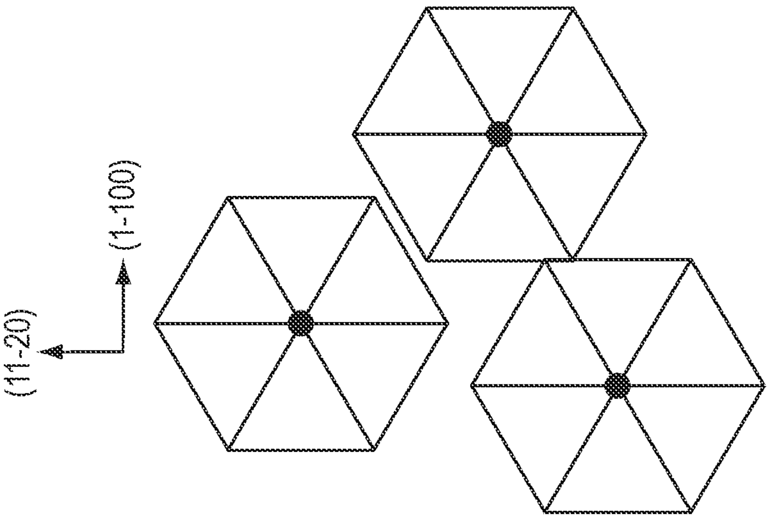
Figure 18A:
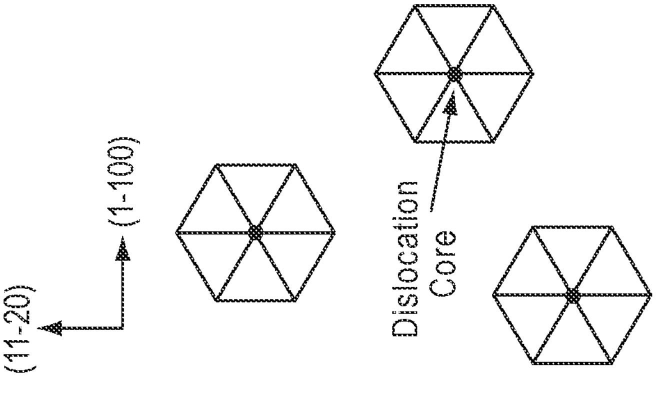
Figure 19:
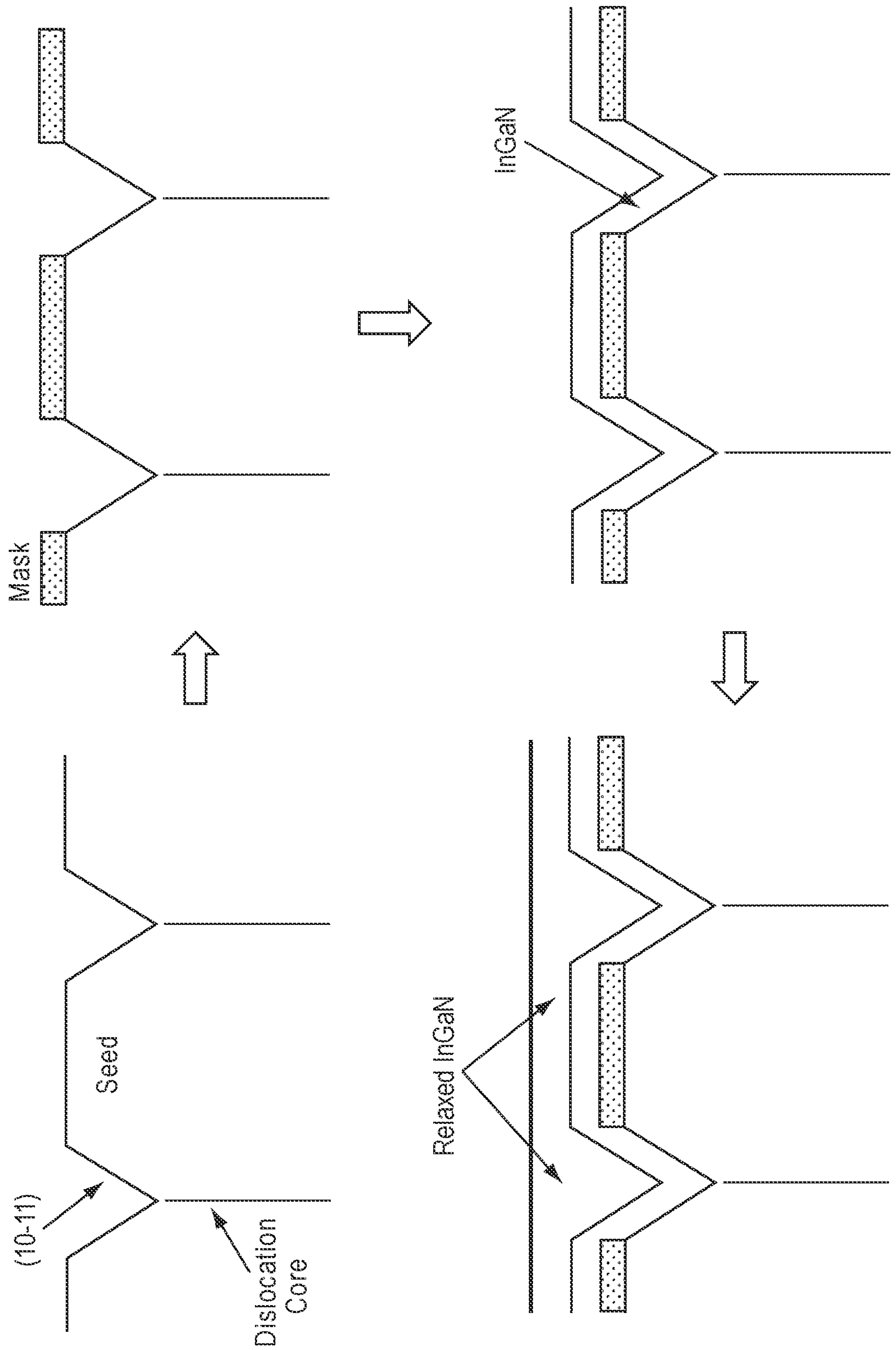
FIG. 19 shows the progressive growth of InGaN on (10-11) GaN seed facets to provide a relaxed InGaN region.
Figure 20:
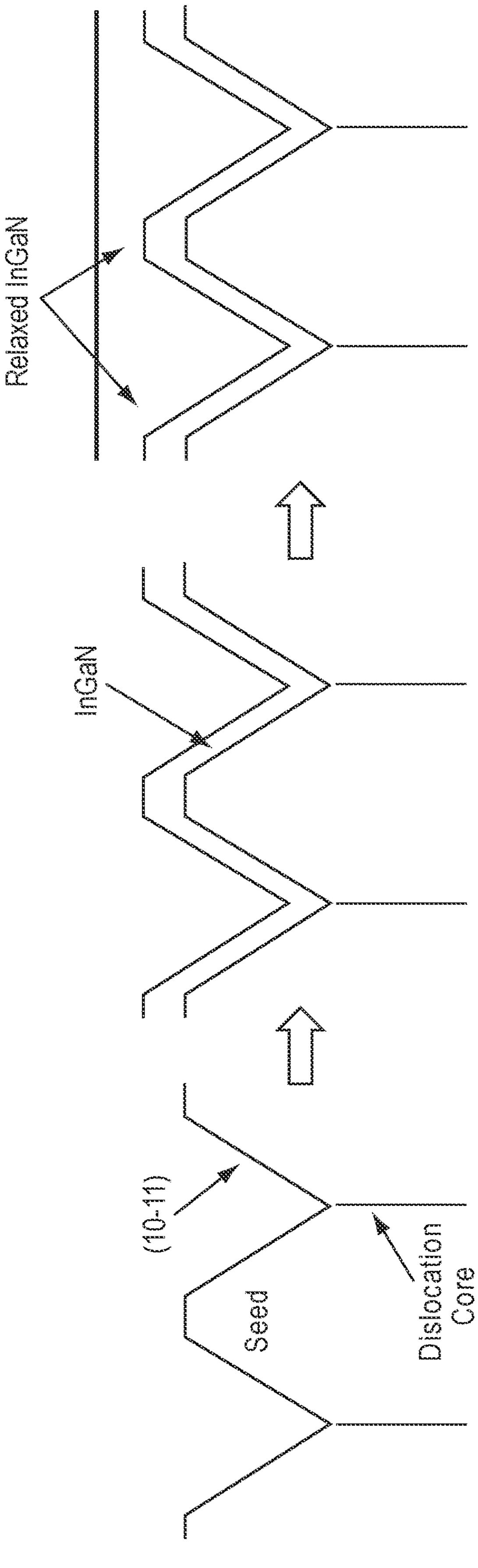
FIG. 20 shows an example of the progressive growth of InGaN on (10-11) GaN seed facets to provide a relaxed InGaN region.

FIGS. 18-20 illustrate aspects of the invention. FIGS. 18A, 18B, and 18C show plan view schematics of so-called "v-pit" structures that can form in III-nitride growth on the basal plane. In particular, for III-nitride material grown at low temperatures, e.g., GaN grown using MOCVD at temperatures less than 800° C., adatom kinetics are such that semiconductor material does not tend to fill in near dislocation cores, causing pits to form from stable (10-11) planes with dislocation cores at the epicenter. As growth continues under the low-temperature conditions, the pits become larger (FIG. 18B) and collide (FIG. 18C). As the pits become larger, the total surface area of exposed (10-11) facets becomes comparable to or even larger than that of the exposed (0001) surface. The presence of this large surface area of (10-11) facets, with each facet being crystallographically equivalent, provides an opportunity to form high quality, relaxed InGaN on (10-11) seed surfaces, e.g., GaN, as conceived in the present invention.

For example, as shown in FIG. 19, GaN can be nucleated at low temperature onto a suitable substrate, such as GaN, sapphire, Si, SiC, MN, etc. Once a reasonably high quality GaN epitaxial film is achieved, for example, by growing a GaN epitaxial film at elevated temperatures (e.g., greater than 900° C.), the growth conditions can be altered again so that v-pits are formed, for example, by growing GaN at temperatures below 800° C. The growth can then be discontinued, the GaN structure removed from the MOCVD reactor, and a suitable growth-mask layer such as a dielectric layer of $SiO_2$, or $SiN_x$ can be selectively deposited on the (0001) surface, but not on the (10-11) surfaces. This can be achieved by various means such as by using high-angle sputtering or deposition, or by selective deposition of photoresist into the v-pits followed by, for example, deposition and lift-off The GaN structure can then be returned to the reactor such as an MOCVD or MBE reactor. Then, InGaN, optionally preceded by the deposition of a thin layer of GaN, can be grown selectively on the exposed GaN seed region material on the (10-11) facets. The InN molar fraction can be targeted so as to induce large strain and thus relaxation upon increased thickness of the InGaN layer. The InGaN growth can be allowed to continue to grow out over the masked regions and to coalesce, providing a planar, high quality, relaxed InGaN (0001) region, which can serve as a template for device fabrication, as described in the present disclosure.

The InGaN layers can be grown at higher temperatures than is typical for InGaN/GaN growth such as at temperatures greater than 900° C., which is possible because the relaxed InGaN material incorporates In much more easily than InGaN pseudomorphic to GaN. The increased growth temperature allows filling in the v-pit defects and providing a coalesced, planar film. Control over the morphology and compositional uniformity of the relaxed InGaN growth can be facilitated by growing multilayer structures, rather than by using bulk InGaN layers. For example, a 25% bulk InGaN layer can be replaced by alternating layers of 3 nm GaN and 1 nm InN, or 2 nm GaN and 2 nm $In_{0.5}Ga_{0.5}N$. Layer thicknesses for the individual layers can range, for example, from 0.5 nm to 100 nm, such as from 1 nm to 30 nm. Many periods of such multi-layer structures may be used, such as from 2 to 10 layers, from 2 to 100 layers, or greater than 100 layers.

In another example, the masking step can be eliminated, and the entire process can be completed in situ in the growth chamber. For example, as shown in FIG. 20, GaN can be nucleated onto a suitable substrate, such as GaN, sapphire, Si, MN, etc. After a reasonably high quality GaN epitaxial film is achieved, for example, by growing at elevated temperatures (e.g., >900° C.), the growth conditions can be altered again so that v-pits are formed, for example, by growing GaN at temperatures below 800° C. The v-pits can be grown out so that the exposed surface area of the {10-11} equivalent facets is larger than the exposed surface area of (0001) GaN. Preferably, the exposed surface area of the (10-11) facets is more than twice that of the exposed surface area of (0001) GaN, and more preferably ten times that of the exposed surface area of (0001) GaN. Then, InGaN can be grown selectively on the (10-11) facets which are the seed regions. The InN composition can be targeted so as to induce large strain and thus relaxation upon increased thickness of the InGaN layer. The InGaN growth can be allowed to continue to grow out and coalesce, providing a planar, high quality, relaxed InGaN (0001) region, which can serve as a template for device fabrication, as described in the present disclosure.

Because the (0001) growth surface area is smaller than the (10-11) growth surface area, the latter growth mode dominates, allowing the InGaN to relax and become the dominant growth surface with increasing film thickness. It can be useful to grow the InGaN layers at higher temperatures than is typical for InGaN/GaN growth, which is possible because the relaxed InGaN material can incorporate In much more easily than InGaN pseudomorphic to GaN. The increased growth temperature allows the v-pit defects to fill in to provide a coalesced, planar film. Control over the morphology and compositional uniformity of the relaxed InGaN growth can be facilitated by growing multilayer structures, rather than by using bulk InGaN layers. For example, a 25% bulk InGaN layer may be replaced by alternating layers of 3 nm GaN and 1 nm InN, or 2 nm GaN and 2 nm $In_{0.5}Ga_{0.5}N$. Layer thicknesses for the individual layers can range, for example, from 0.5 nm to 100 nm, such as from 1 nm to 30 nm. Many periods of such multilayer structures can be used, such as from 2 to 10 layers, from 2 to 100 layers, or greater than 100 layers.

As an example, a c-plane (0001) sapphire substrate can be loaded into a MOCVD reactor capable of supplying at least tri-methyl gallium, tri-methyl indium, and ammonia. A low-temperature GaN nucleation layer can be provided, followed by higher temperature GaN growth which can include three-dimensional island formation before coalescing into a two-dimensional (0001) GaN film. This three- to two-dimensional transition helps redirect threading dislocations laterally and helps to reduce the overall threading dislocation density at the growth surface, which can be reduced to less than 1E9 $cm^{-2}$. A dislocation density of 1E8 $cm^{-2}$ can be achieved eventually in the planar GaN layer. Next, the growth temperature can be reduced (e.g., less than 800° C.) to form v-pit structures at dislocation cores, which are characterized by inclined (10-11) planes. These planes can form an angle with respect to the (0001) growth surface of about 63 degrees. The thickness of the low temperature layer controls the v-pit height and is increased by growth such that the total surface area of exposed {10-11} facets is greater than the surfaced area of (0001), as shown in Table 3 for this specific example.

TABLE 3

Examples of growth structures.

| | | | | | |
|---|---|---|---|---|---|
| V-pit height (μm) | 0.01 | 0.10 | 0.14 | 0.20 | 0.25 |
| 10-11 surface area per V-pit ($\mu m^2$) | 0.038 | 0.377 | 0.528 | 0.754 | 0.943 |
| % Surface Area Ratio (10-11) | 03.8% | 37.7% | 52.8% | 75.4% | 94.3% |

For example, in the case of a dislocation density of 1E8 $cm^{-2}$, the target v-pit height can be 0.14 μm or greater.

After the target surface area-ratio between the (10-11) and (0001) material can achieved, TMI is flowed into the chamber to grow one or more InGaN layers on the (10-11) seed regions and to induce strain relaxation. The InGaN layers can be alternated by GaN layers periodically. For example, each InGaN layer can be from 0.5 nm to 100 nm thick, such as from 1 nm to 30 nm thick, and can be sandwiched between GaN layers having a similar thickness. To induce strain relaxation, the average composition of the strain relaxation layers should be reasonably high, for example, the average InN content can be greater than 5%. After or before strain relaxation is initiated, the growth temperature can be raised to help planarize the growth and achieve a planar, uniform, relaxed (0001) InGaN layer for device fabrication.

It is important to note that although the foregoing discussion is directed to GaN seed regions, it is also possible to utilize InGaN (or AlGaN) seed regions, provided the material is pseudomorphic to any underlying GaN layer, e.g., GaN nucleation and/or buffer layers. The seed regions are regions in the vicinity of the InGaN—GaN (or InGaN—InGaN) heterojunctions that eventually induce relaxation. The seed material below these regions is referred to as seed material and not seed regions.

Relaxed InGaN layers and semiconductor structures comprising relaxed InGaN layers provided by the present disclosure can be used to fabricate electronic and optoelectronic devices including InGaN-based optoelectronic devices such as LEDs and LDs (and VCSELs). LEDs and LDs comprising relaxed InGaN layers provided by the present disclosure can be used in lighting systems and display systems. In particular, for LEDs, devices may be formed on a relaxed InGaN base layer on a substrate. The substrate can be thinned by techniques such as grinding, lapping, or etching, and can be diced by means known in the art such as sawing, scribe-and-break, or laser scribing and breaking, to provide individual LED chips or dies. LED chips or die dimensions can be from, for example, from 250 $\mu m^2$ to 10 $mm^2$. Individual LED chips can then be attached to suitable package elements, which provide leads for electrical contacting and heatsinking the devices. Die-attach can be accomplished using any suitable method such as epoxy or silicone attachment, or solder-based attach. Electrical connection for the chip to the package can be completed by using bond wire such as Au or Ag wires, to connect the anode and cathode leads in the package to respective contact metallizations, i.e., electrodes, on the LED chip. In the case of flip-chip devices, electrical contact can be made through an intermediary submount, positioned between the LED chip and package. The chip electrodes can be attached to the submount carrier by means such as solder attach or Au-bump attach. The submount carrier can be diced and then mounted into the package by any suitable method.

Desired emission color from the packaged LED device is obtained by fabricating and providing a relaxed InGaN-based LED, with a desired peak emission wavelength. Multiple such LED chips, optionally with different peak emission wavelengths, can be included in separate packages, or combined together in a multi-chip package. For example, a single package can include red-emitting, green-emitting, and blue-emitting LED chips, which may be arranged in a circuit and electrically coupled to a driver circuit, either within or outside the package, for operating the LEDs. The circuit details and driver can be selected to allow the different color LEDs to operate separately, or together, to provide a wide range of total emission characteristics, including white light emission for use in illumination applications, or for use as a backlight for a liquid crystal display (LCD) device, such as a television display, computer monitor, mobile phone display, wearable display device, etc.

One or more LED chips can be combined with luminescent down-conversion materials to provide a desired emission spectrum. Such luminescent down-conversion materials may include phosphors, semiconductor nanoparticles such as quantum dots, or perovskite materials. Multiple luminescent down-conversion materials can be combined together in a single package. The LED chip emission wavelength can be selected to excite the luminescent down-conversion materials so that emission from the package is a combination of the LED chip direct emission and that of the luminescent down-conversion material, or the emission may be primarily just that of the luminescent down-conversion material, with the LED chip light fully absorbed by the luminescent down-conversion materials or otherwise blocked or filtered from exiting the package. Packaged LEDs using luminescent down-conversion materials can be used to produce white light, which can be useful in illumination applications. Such devices can be electrically coupled to driver circuits, powered by an external power source such as mains or battery power, thermally coupled to a heatsink, and optically coupled to various optics or lenses to provide lighting devices such as LED lamps or LED light fixtures.

LED chips with smaller dimensions may be fabricated using the present invention. In particular, devices with dimensions from 1 $\mu m^2$ to 50 $\mu m^2$, so called "microLEDs", can be fabricated. For micro-LEDs, conventional dicing techniques are less suitable and therefore other means for singulating devices are often employed. For example, dicing may be enabled by forming LEDs of desired dimensions on a substrate, and then bonding the top surfaces of the LEDs to a carrier, such as blue tape or a submount carrier, then removing the substrate. The individual devices may then be picked up and placed into a package element or onto a backplane for microLED based display. Advanced die-handling techniques, as known in the art, can be used for handling microLED devices. In particular, red-emitting, green-emitting, and blue-emitting LEDs based on the present invention may be formed into microLEDs and arranged to provide a microLED display and incorporated into systems such as televisions, computer monitors, tablets, mobile phones, wearable device, etc.

LDs incorporating relaxed InGaN layers provided by the present disclosure can also be incorporated into various systems. LD packaging is similar to LED packaging as described herein, except that means are provided for managing the higher power densities in a LD device from a thermal perspective and means for optically accessing the laser facet is provided. LDs of multiple emission colors may be provided in separate packages or combined into a single package. LDs may be coupled to luminescent down-conversion materials to provide a desired emission spectrum. LDs are useful in applications wherein very high light density is required, such as in automotive forward lighting systems, or projection displays, which may include light modulation means such as rastering optics, micro-mirror devices, or LCD modulators.

Examples of lighting and display systems are shown in FIGS. 11 and 12.

Aspects of the Invention

The invention is further defined by the following aspects.

Aspect 1. A III-nitride semiconductor structure, comprising an InGaN region, wherein the InGaN region comprises a relaxed (0001) InGaN region; and the relaxed (0001) InGaN region has an in-plane a-lattice parameter characterized by a periodicity in at least one direction.

Aspect 2. The semiconductor structure of aspect 1, wherein the relaxed InGaN region is characterized by a c-plane growth orientation.

Aspect 3. The semiconductor structure of any one of aspects 1 to 2, wherein the relaxed InGaN region is characterized by a mean in-plane a-lattice parameter greater than 3.19 Å.

Aspect 4. The semiconductor structure of any one of aspects 1 to 3, wherein the relaxed InGaN region has a thickness less than 3 μm.

Aspect 5. The semiconductor structure of any one of aspects 1 to 4, wherein the relaxed InGaN region has a thickness from 20 nm to 1 μm.

Aspect 6. The semiconductor structure of any one of aspects 1 to 5, wherein the relaxed InGaN region has a defect density less than 5E9 $cm^2$.

Aspect 7. The semiconductor structure of any one of aspects 1 to 6, wherein the relaxed InGaN region comprises an InGaN—GaN superlattice.

Aspect 8. The semiconductor structure of any one of aspects 1 to 7, further comprising: a plurality of mask regions underlying a first portion of the relaxed InGaN region; and a plurality of non-mask regions underlying a second portion of the relaxed InGaN region.

Aspect 9. The semiconductor structure of aspect 8, wherein each of the plurality of mask regions comprises a dielectric material.

Aspect 10. The semiconductor structure of aspect 9, wherein the dielectric material comprises silicon nitride, silicon oxide, or aluminum oxide.

Aspect 11. The semiconductor structure of any one of aspects 8 to 10, wherein each of plurality of mask regions has a thickness from 20 nm to 2 μm.

Aspect 12. The semiconductor structure of any one of aspects 8 to 10, wherein each of the plurality of mask regions has a thickness less than 2 μm.

Aspect 13. The semiconductor structure of any one of aspects 8 to 12, wherein a maximum in-plane dimension of each of the plurality of non-mask regions is less than 1 μm.

Aspect 14. The semiconductor structure of any one of aspects 8 to 13, further comprising a seed region underlying each of the plurality of mask regions.

Aspect 15. The semiconductor structure of aspect 14, wherein the seed region comprises GaN, MN, or AlGaN.

Aspect 16. The semiconductor structure of any one of aspects 14 to 15, wherein the seed region has a thickness from 20 nm to 2 μm.

Aspect 17. The semiconductor structure of any one of aspects 14 to 16, wherein the seed region has a thickness less than 2 μm.

Aspect 18. The semiconductor structure of any one of aspects 14 to 17, wherein, a seed region comprises a horizontal interface and a seed interface; the horizontal interface is substantially co-planar with the (0001) InGaN crystallographic plane; and\the seed interface comprises a planar seed portion that is not parallel to the horizontal interface.

Aspect 19. The semiconductor structure of aspect 18, wherein the planar seed portion comprises an a-plane, an m-plane, or a plane between an a-plane and an m-plane.

Aspect 20. The semiconductor structure of aspect 19, wherein, the horizontal interface is characterized by a c-plane orientation; and the planar seed portion is not co-planar with the horizontal interface.

Aspect 21. The semiconductor structure of any one of aspects 19 to 20, wherein the planar seed portion comprises a heterojunction.

Aspect 22. The semiconductor structure of aspect 21, wherein the heterojunction is a GaN—InGaN heterojunction.

Aspect 23. The semiconductor structure of aspect 22, wherein, the seed region comprises GaN; the planar seed portion comprises a GaN/InGaN heterojunction; and the GaN/InGaN heterojunction is substantially parallel a the GaN (1-100) crystallographic plane, a GaN (11-20) crystallographic plane, or a crystallographic plane between a GaN (1-100) and a GaN (11-20) crystallographic plane.

Aspect 24. The semiconductor structure of any one of aspects 8 to 23, wherein the plurality of non-mask regions comprises InGaN.

Aspect 25. The semiconductor structure of any one of aspects 8 to 24, wherein the plurality of non-mask regions is characterized by a pattern.

Aspect 26. The semiconductor structure of any one of aspects 8 to 25, wherein the plurality of non-mask regions is characterized by a non-mask region periodicity in at least one dimension.

Aspect 27. The semiconductor structure of aspect 26, wherein the periodicity of the in-plane a-lattice parameter of the relaxed InGaN region corresponds to the non-mask region periodicity.

Aspect 28. The semiconductor structure of any one of aspects 8 to 27, wherein the plurality of non-mask regions is characterized by an array of shapes.

Aspect 29. The semiconductor structure of aspect 28, wherein a shape comprises an edge that is oriented with respect to a crystallographic plane of InGaN.

Aspect 30. The semiconductor structure of aspect 29, wherein the edge is mis-oriented by +/−1° with respect to with respect to an InGaN a-plane or an InGaN m-plane.

Aspect 31. The semiconductor structure of any one of aspects 29 to 30, wherein the edge is oriented parallel to a (1-100) InGaN crystallographic plane.

Aspect 32. The semiconductor structure of any one of aspects 29 to 31, wherein the edge is oriented parallel to a (11-20) InGaN crystallographic plane.

Aspect 33. The semiconductor structure of any one of aspects 29 to 31, wherein the edge is oriented in a direction that is not parallel to a (1-100) InGaN crystallographic plane and is not parallel to a (11-20) InGaN crystallographic plane.

Aspect 34. The semiconductor structure of any one of aspects 8 to 33, further comprising a substrate underlying each of the plurality of non-mask regions and the each of the plurality of mask regions.

Aspect 35. The semiconductor structure of aspect 34, wherein the substrate comprises sapphire, silicon, silicon-carbide, gallium-nitride, silicon-on-insulator (SOI), or aluminum-nitride.

Aspect 36. The semiconductor structure of any one of aspects 8 to 35, further comprising: a substrate underlying each of the plurality of non-mask regions; and a cavity within the non-mask region and overlying a portion of the substrate.

Aspect 37. The semiconductor structure of any one of aspects 1 to 36, wherein the III-V semiconductor structure has an area defined by a width and a length; and the area is greater than 0.1 $mm^2$.

Aspect 38. The semiconductor structure of aspect 37, wherein the periodicity is characterized by a period that is at least 10 times less than the width and/or at least 10 times less than the length.

Aspect 39. The semiconductor structure of any one of aspects 37 to 38, wherein a number of non-mask regions within the area is greater than 10.

Aspect 40. The semiconductor structure of any one of aspects 1 to 39, wherein, within a period associated with the periodicity, the in-plane a-lattice parameter varies between a minimum and maximum value around a mean in-plane a-lattice parameter of less than 1%.

Aspect 41. The semiconductor structure of any one of aspects 1 to 40, further comprising a plurality of seed regions underlying a first portion of the relaxed InGaN region, wherein, each of the plurality of seed regions comprise a plurality of planar seed portions; and each of the plurality of planar seed portions are not co-planar (0001) InGaN crystallographic plane.

Aspect 42. The semiconductor structure of aspect 41, wherein the planar seed portions form at least a portion of a pyramidal shape having a hexagonal base.

Aspect 43. The semiconductor structure of any one of aspects 41 to 42, wherein each of the plurality of planar seed portions is characterized by a (1-101) crystallographic plane.

Aspect 44. The semiconductor structure of any one of aspects 41 to 43, further comprising a plurality of mask regions underlying a second portion of the relaxed InGaN region, wherein each of the plurality of seed portions extends above the plurality of mask regions.

Aspect 45. The semiconductor structure of aspect 44, further comprising a seed layer underlying each of the plurality of mask regions and underlying each of the plurality of seed regions.

Aspect 46. The semiconductor structure of aspect 45, wherein the seed layer and each of the plurality of seed regions are contiguous.

Aspect 47. The semiconductor structure of aspect 46, further comprising a substrate underlying the seed layer.

Aspect 48. The semiconductor structure of any one of aspects 44 to 47, further comprising a substrate underlying each of the plurality of seed regions and underlying each of the plurality of mask regions.

Aspect 49. The semiconductor structure of any one of aspects 1 to 48, wherein in a plane parallel to the InGaN c-plane and through the relaxed InGaN region, the in-plane a-plane lattice parameter is greater than 3.19 Å.

Aspect 50. The semiconductor structure of any one of aspects 1 to 49, further comprising a plurality of non-mask regions underlying a portion of the relaxed InGaN region, wherein a periodicity of the lattice parameter of the relaxed InGaN region corresponds to a periodicity of the plurality of non-mask regions.

Aspect 51. The semiconductor structure of any one of aspects 1 to 50, further comprising a plurality of seed regions underlying a portion of the relaxed InGaN region, wherein, each of the plurality of seed regions is characterized by an in-plane a-lattice parameter a1; the relaxed InGaN region is characterized by an in-plane a-lattice parameter a2; and a2 is greater than a1.

Aspect 52. The semiconductor structure of any one of aspects 1 to 51, further comprising a plurality of seed regions underlying a portion of the relaxed InGaN region, wherein, the relaxed InGaN region and the plurality of the seed regions form a plurality of heterojunctions; and each of the plurality of heterojunctions is not parallel to the growth plane of the seed region and the relaxed InGaN region.

Aspect 53. The semiconductor structure of any one of aspects 1 to 52, further comprising a plurality of seed regions underlying a portion of the relaxed InGaN region, wherein, the relaxed InGaN region and the plurality of the seed regions form a plurality of heterojunctions; and each of the plurality of heterojunctions is perpendicular to the c-plane of the relaxed InGaN region.

Aspect 54. The semiconductor structure of any one of aspects 1 to 53, further comprising a plurality of seed regions underlying a portion of the relaxed InGaN region, wherein, the relaxed InGaN region and the plurality of the seed regions form a plurality of heterojunctions; and each of the plurality of heterojunctions is parallel to the InGaN a-plane, parallel to the InGaN m-plane, or at angle between the InGaN a-plane and the InGaN m-plane.

Aspect 55. The semiconductor structure of any one of aspects 1 to 54, further comprising a plurality of seed regions underlying a portion of the relaxed InGaN region, wherein, the plurality of seed regions is characterized by a periodicity in at least one direction; and the periodicity of the in-plane a-lattice parameter of the relaxed InGaN region corresponds to the periodicity of the plurality of seed regions.

Aspect 56. The semiconductor structure of aspect 55, wherein the periodicity of the in-plane a-lattice parameter of the relaxed InGaN region is the same as the periodicity of the plurality of seed regions.

Aspect 57. The semiconductor structure of any one of aspects 1 to 56, further comprising an n-doped semiconductor layer, an active semiconductor layer, and a p-doped semiconductor layer overlying the relaxed InGaN region.

Aspect 58. The semiconductor structure of any one of aspects 1 to 57, further comprising a plurality of semiconductor epitaxial layers overlying the relaxed InGaN region.

Aspect 59. A III-nitride semiconductor structure, comprising: an InGaN region, wherein the InGaN region comprises a relaxed (0001) InGaN region; a plurality of mask regions underlying a first portion of the relaxed InGaN region; a plurality of non-mask regions underlying a second portion of the relaxed InGaN region; and a seed region underlying each of the mask regions.

Aspect 60. The semiconductor structure of aspect 59, wherein, the seed regions comprise GaN; and the non-mask regions between the seed regions and underlying the second portion of the InGaN region comprise InGaN.

Aspect 61. The semiconductor structure of any one of aspects 59 to 60, wherein, in a plane parallel to the c-plane of the relaxed InGaN region and bisecting a seed region, an in-plane a-lattice parameter within the seed region is less than the in-plane a-lattice parameter between seed regions and underlying the second portion of the InGaN region.

Aspect 62. A semiconductor device comprising the III-V semiconductor structure of any one of aspects 1 to 61.

Aspect 63. The semiconductor device of aspect 62, wherein the semiconductor device comprises an optoelectronic device.

Aspect 64. The semiconductor device of aspect 62, wherein the semiconductor device comprises a light emitting diode or a laser diode.

Aspect 65. The semiconductor device of aspect 64, further comprising a peak emission wavelength.

Aspect 66. The semiconductor device of aspect 65, wherein the peak emission wavelength is between 440 nm and 460 nm, and the in-plane a-lattice parameter is between 3.196 Å and 3.214 Å.

Aspect 67. The semiconductor device of aspect 65, wherein the peak emission wavelength is between 520 nm and 540 nm, and the in-plane a-lattice parameter is between 3.235 Å and 3.253 Å.

Aspect 68. The semiconductor device of aspect 65, wherein the peak emission wavelength is between 580 nm and 600 nm, and the in-plane a-lattice parameter is between 3.260 Å and 3.282 Å.

Aspect 69. The semiconductor device of aspect 65, wherein the peak emission wavelength is between 620 and 640 nm, and the in-plane a-lattice parameter is between 3.282 and 3.296 Å.

Aspect 70. The semiconductor device of aspect 65, wherein the peak emission wavelength is between 690 and 710 nm, and the in-plane a-lattice parameter is between 3.303 Å and 3.324 Å.

Aspect 71. The semiconductor device of aspect 65, wherein the peak emission wavelength is between 840 nm and 870 nm, and the in-plane a-lattice parameter is between 3.346 Å and 3.367 Å.

Aspect 72. The semiconductor device of aspect 65, wherein the peak emission wavelength is between 940 nm and 980 nm, and the in-plane a-lattice parameter is between 3.374 Å and 3.392 Å.

Aspect 73. The semiconductor device of aspect 65, wherein the peak emission wavelength is between 1300 nm and 1350 nm, and the in-plane a-lattice parameter is between 3.435 Å and 3.456 Å.

Aspect 74. A lighting system comprising the semiconductor device of any one of aspects 62 to 73.

Aspect 75. A display system comprising the semiconductor device of any one of aspects 62 to 73.

Finally, it should be noted that there are alternative ways of implementing the embodiments disclosed herein. Accordingly, the present embodiments are to be considered as illustrative and not restrictive, and the claims are not to be limited to the details given herein but may be modified within the scope and equivalents thereof.

What is claimed is:

1. A III-nitride semiconductor structure, comprising:

(a) pyramidal seed regions comprising GaN, wherein each of the pyramidal seed regions consists of six triangular facets parallel to a crystallographically equivalent {10-11} plane; and (b) an $In_yGa_{1-y}N$ layer wherein $0<y\leq 1$ overlying the pyramidal seed regions, wherein the $In_yGa_{1-y}N$ layer comprises:

an $In_yGa_{1-y}N$ growth region overlying the pyramidal seed regions, wherein the $In_yGa_{1-y}N$ growth region comprises: a sufficiently high molar fraction of InN to induce strain relaxation between the pyramidal seed regions and along a plane parallel to a (0001) plane of the relaxed (0001) $In_yGa_{1-y}N$ region and intersecting $In_yGa_{1-y}N$/GaN heterojunctions; and an average InN molar fraction of the $In_yGa_{1-y}N$ growth region is greater than 5%; and the $In_yGa_{1-y}N$ growth region comprises a planar, relaxed (0001) $In_yGa_{1-y}N$ region characterized by an in-plane a-lattice parameter that is greater than 3.19 Å, wherein the in-plane a-lattice parameter is equal to or nearly equal to that of a fully relaxed $In_yGa_{1-y}N$ material.

2. The III-nitride semiconductor structure of claim 1, wherein each of the pyramidal seed regions is characterized by a hexagonal base.

3. The III-nitride semiconductor structure of claim 1, wherein a region at a midpoint between pyramidal seed regions is the $In_yGa_{1-y}N$ growth region.

4. The III-nitride semiconductor structure of claim 3, wherein the $In_yGa_{1-y}N$ growth region at the midpoint between the pyramidal seed regions is at least partially relaxed.

5. The III-nitride semiconductor structure of claim 1, wherein the pyramidal seed regions are disposed in an array.

6. The III-nitride semiconductor structure of claim 1, further comprising a substrate and a mask region, wherein the pyramidal seed regions overly a first portion of the substrate and the mask region overlies a second portion of the substrate.

7. The III-nitride semiconductor structure of claim 6, wherein the substrate comprises sapphire, silicon, silicon-carbide, gallium-nitride, silicon-on-insulator (SOI), or aluminum-nitride.

8. A semiconductor device comprising the III-nitride semiconductor structure of claim 1.

9. A III-nitride semiconductor structure, comprising:

(a) pyramidal seed regions comprising GaN, wherein each of the pyramidal seed regions consists of six triangular facets parallel to a crystallographically equivalent {10-11} plane;

(b) an $In_yGa_{1-y}N$ growth region overlying the pyramidal seed regions, wherein, $0<y\leq 1$; and the $In_yGa_{1-y}N$ growth region has a sufficiently high molar fraction of InN to induce strain relaxation between the pyramidal seed regions and along a plane parallel to a (0001) plane of the relaxed (0001) $In_yGa_{1-y}N$ region and intersecting $In_yGa_{1-y}N$/GaN heterojunctions, wherein an average InN molar fraction of the $In_yGa_{1-y}N$ growth region is greater than 5%; and (c) a planar, relaxed (0001) $In_yGa_{1-y}N$ region overlying the $In_yGa_{1-y}N$ growth region, wherein, the planar, relaxed (0001) $In_yGa_{1-y}N$ region is characterized by an in-plane a-lattice parameter from 3.20 Å to 3.50 Å; and the in-plane a-lattice parameter is equal to or nearly equal to that of a fully relaxed $In_yGa_{1-y}N$ material.

10. A semiconductor device comprising the III-nitride semiconductor structure of claim 9.

11. A wafer comprising the III-nitride semiconductor structure of claim 1.

12. A wafer comprising the III-nitride semiconductor structure of claim 9.

13. A wafer comprising the semiconductor device of claim 8.

14. A wafer comprising the semiconductor device of claim 10.

* * * * *